United States Patent
Miyazaki et al.

(10) Patent No.: US 12,500,182 B2
(45) Date of Patent: Dec. 16, 2025

(54) SUBSTRATE AND SEMICONDUCTOR PACKAGE

(71) Applicants: SONY GROUP CORPORATION, Tokyo (JP); SONY SEMICONDUCTOR SOLUTIONS CORPORATION, Kanagawa (JP)

(72) Inventors: Hirohito Miyazaki, Kanagawa (JP); Yuji Nishida, Kanagawa (JP); Christopher Wright, London (GB); Bernadette Elliott-Bowman, London (GB); Timothy Beard, London (GB)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 646 days.

(21) Appl. No.: 17/759,344

(22) PCT Filed: Dec. 9, 2020

(86) PCT No.: PCT/JP2020/045920
§ 371 (c)(1),
(2) Date: Jul. 22, 2022

(87) PCT Pub. No.: WO2021/153023
PCT Pub. Date: Aug. 5, 2021

(65) Prior Publication Data
US 2023/0049028 A1  Feb. 16, 2023

(30) Foreign Application Priority Data

Jan. 31, 2020 (JP) .................................. 2020-015675
Aug. 31, 2020 (JP) .................................. 2020-146222

(51) Int. Cl.
*H01L 23/00* (2006.01)
*G01R 31/28* (2006.01)

(52) U.S. Cl.
CPC ........ *H01L 23/562* (2013.01); *G01R 31/2896* (2013.01); *H01L 24/16* (2013.01); *H01L 2224/16227* (2013.01)

(58) Field of Classification Search
CPC . H01L 22/34; H01L 22/30; H01L 2224/0401; H01L 2224/04105;
(Continued)

(56) References Cited

U.S. PATENT DOCUMENTS 6,611,635 B1 * 8/2003 Yoshimura .............. H01L 24/96
257/E25.032
7,928,591 B2 * 4/2011 Chen ........................ H01L 24/81
257/797
(Continued)

FOREIGN PATENT DOCUMENTS

JP 01-207671 A 8/1989
JP 09-015288 A 1/1997
(Continued)

OTHER PUBLICATIONS

International Search Report and Written Opinion of PCT Application No. PCT/JP2020/045920, issued on Mar. 2, 2021, 11 pages of ISRWO.

*Primary Examiner* — Sophia T Nguyen
(74) *Attorney, Agent, or Firm* — CHIP LAW GROUP

(57) ABSTRACT

Damage to a joint part of a terminal of an electronic component mounted on a substrate is detected. The substrate includes a base material unit, a land, and a light detection unit. The land included in the substrate is arranged with a stress light emitting body configured to emit light in accordance with stress, includes a transparent member, and is joined with a terminal of an element arranged in the base (Continued)

material unit included in the substrate. The light detection unit included in the substrate is arranged between the base material unit and the land included in the substrate, and detects light from the stress light emitting body.

15 Claims, 13 Drawing Sheets

(58) Field of Classification Search
CPC .. H05K 1/0274; H05K 1/0268; H05K 1/0269; H05K 1/0271; H05K 1/185; H05K 3/3436; H05K 3/4602; H05K 2201/10151; G01L 1/24; G01L 1/247; G01R 31/2896
See application file for complete search history.

(56) References Cited

U.S. PATENT DOCUMENTS

| | | | | |
|---|---|---|---|---|
| 8,829,918 | B2 * | 9/2014 | Sylvester | H01L 22/32 324/757.04 |
| 9,240,387 | B2 * | 1/2016 | Chen | H01L 24/73 |
| 9,355,544 | B1 * | 5/2016 | Bean | G08B 1/08 |
| 11,327,259 | B2 * | 5/2022 | Li | H01L 24/14 |
| 2002/0197456 | A1 * | 12/2002 | Pope | H01J 29/32 428/209 |
| 2004/0150081 | A1 * | 8/2004 | Ogawa | H01L 24/97 257/678 |
| 2005/0168139 | A1 * | 8/2005 | Xu | G01L 1/24 313/506 |
| 2007/0104413 | A1 * | 5/2007 | Hsu | H01L 23/48 385/14 |
| 2007/0116946 | A1 * | 5/2007 | Rustin | C09K 11/64 252/301.16 |
| 2009/0146992 | A1 * | 6/2009 | Fukunaga | G02F 1/13338 345/214 |
| 2010/0070204 | A1 * | 3/2010 | Monda | H05K 3/3436 702/35 |
| 2010/0289500 | A1 * | 11/2010 | Itoh | H01L 23/49816 361/803 |
| 2011/0309357 | A1 * | 12/2011 | Tain | G01L 1/18 257/48 |
| 2012/0176149 | A1 * | 7/2012 | Yamayose | H05K 1/0268 257/E23.002 |
| 2012/0179391 | A1 * | 7/2012 | Omori | H05K 1/0268 702/35 |
| 2013/0093084 | A1 * | 4/2013 | Chen | H01L 24/32 257/738 |
| 2014/0064659 | A1 * | 3/2014 | Doerr | G02B 6/428 385/14 |
| 2014/0203175 | A1 * | 7/2014 | Kobrinsky | G02B 6/4214 250/214.1 |
| 2016/0169453 | A1 | 6/2016 | Jeong et al. | |
| 2016/0349307 | A1 * | 12/2016 | Komatsu | H03K 19/20 |
| 2017/0156650 | A1 * | 6/2017 | Bower | A61B 5/14552 |
| 2017/0238390 | A1 * | 8/2017 | Yamakawa | H05B 45/20 315/294 |
| 2018/0198044 | A1 * | 7/2018 | Leirer | H10H 20/857 |
| 2019/0393112 | A1 * | 12/2019 | Nofen | H01L 23/5381 |
| 2022/0003948 | A1 * | 1/2022 | Zhou | G02F 1/212 |
| 2022/0159860 | A1 * | 5/2022 | Winzer | G02B 6/4278 |

FOREIGN PATENT DOCUMENTS

| | | | |
|---|---|---|---|
| JP | 10-180437 A | 7/1998 | |
| JP | H10224021 A | 8/1998 | |
| JP | 2001-291738 A | 10/2001 | |
| JP | 2004-354520 A | 12/2004 | |
| JP | 2006-337385 A | 12/2006 | |
| JP | 2010267904 A * | 11/2010 | H01L 22/34 |
| JP | 2011-209199 A | 10/2011 | |
| JP | 2012-057119 A | 3/2012 | |
| JP | 2016-215517 A | 12/2016 | |
| JP | 2020-016624 A | 1/2020 | |
| WO | 2007/015532 A1 | 2/2007 | |

* cited by examiner

SUBSTRATE AND SEMICONDUCTOR PACKAGE

CROSS REFERENCE TO RELATED APPLICATIONS

This application is a U.S. National Phase of International Patent Application No. PCT/JP2020/045920 filed on Dec. 9, 2020, which claims priority benefit of Japanese Patent Application No. JP 2020-015675 filed in the Japan Patent Office on Jan. 31, 2020, and also claims priority benefit of Japanese Patent Application No. JP 2020-146222 filed in the Japan Patent Office on Aug. 31, 2020. Each of the above-referenced applications is hereby incorporated herein by reference in its entirety.

TECHNICAL FIELD

The present disclosure relates to a substrate and a semiconductor package. Specifically, the present disclosure relates to a substrate on which an element such as an electronic component is mounted, and a semiconductor package.

BACKGROUND ART

Conventionally, a device that detects damage to a substrate on which an electronic component is mounted has been proposed. For example, a device that detects disconnection of a wiring line arranged in a substrate by using an organic light emitting element has been proposed (see, for example, Patent Document 1).

This organic light emitting element is an element in which a light emitting layer is sandwiched between an anode and a cathode, and a voltage is applied to the light emitting layer via the anode and the cathode to cause light emission. Furthermore, in the organic light emitting element, a common anode and a plurality of cathodes respectively corresponding to a plurality of wiring lines to be inspected are arranged. At a time of detecting disconnection of the wiring line of the substrate, the cathode is brought into contact with one end of the wiring line to be inspected, and a voltage is applied between another end of the wiring line and the anode to cause the organic light emitting element to emit light. Since the organic light emitting element does not emit light in the wiring line in which the disconnection has occurred, the disconnection of the wiring line can be detected.

Furthermore, there has been proposed a module capable of detecting breakage of a bonding material connecting an active element and a circuit pattern at a joint part and predicting a failure of a circuit substrate including the joint part of the active element (see Patent Document 2). In this module, a detection circuit is separately provided on the substrate in the vicinity of an electronic component having a large amount of current and a large amount of heat generation. Furthermore, this detection circuit includes a first conductor including different metal or different alloy and a second conductor detector joined to the first conductor. Note that the electronic component includes a plurality of electrodes, and the electrodes are connected to the circuit pattern of the substrate via gold bumps.

In such a module, when the detector included in the detection circuit is heated by heat generated by the electronic component, breakage occurs at a joint part between the first conductor and the second conductor constituting the detector, and disconnection occurs. As a result, conduction cannot be achieved before failure in the circuit substrate itself, so that failure of the circuit substrate can be predicted.

CITATION LIST

Patent Document

Patent Document 1: Japanese Patent Application Laid-Open No. H09-015288
Patent Document 2: Japanese Patent Application Laid-open No. 2011-209199

SUMMARY OF THE INVENTION

Problems to be Solved by the Invention

In the related art described in Patent Document 1 described above, there is a problem that breakage of a substrate on which an electronic component is mounted cannot be detected. The electronic component is mounted, for example, by joining a terminal of the electronic component to a land arranged in the substrate. This joining is performed by soldering, for example. Furthermore, the substrate on which the electronic component is mounted is used by being mounted on an electronic device. During use of the electronic device, a joint part between the terminal of the electronic component and the land of the substrate may be damaged. For example, due to a change in temperature during use, the substrate and the electronic component repeat expansion and contraction. In a case where thermal expansion coefficients of the substrate and the electronic component are different from each other, a difference in displacement between expansion and contraction occurs, and stress is generated in a joint portion. When this stress increases, damage such as breakage of the joint part occurs. In the related art described in Patent Document 1 described above, there is a problem that it is not possible to detect such damage in the joint part of the terminal of the electronic component.

Whereas, in the related art described in Patent Document 2, the detector provided in the detection circuit detects an occurrence of a failure of a joint part or the like connecting the electronic component and the circuit pattern due to heat generation of the electronic component. However, in order to sense the breakage, it is necessary to specially install separately the detection circuit on the substrate.

The present disclosure has been made in view of the above-described problems, and an object is to enable to detect damage of a joint part between with a terminal of a mounted electronic component and damage of a semiconductor package, without installing a detection circuit on a substrate.

Solutions to Problems

The present disclosure has been made to solve the above-described problems, and a first aspect thereof is a substrate including: a base material unit; a land arranged with a stress light emitting body that emits light in accordance with stress, including a transparent member, arranged in the above-described base material unit, and joined with a terminal of an element; and a light detection unit arranged between the above-described base material unit and the above-described land and configured to detect light from the stress light emitting body.

Furthermore, in this first aspect, the above-described stress light emitting body may be particularly arranged only in a land at a corner among a plurality of lands to which a plurality of terminals of the above-described element is joined.

Furthermore, in this first aspect, a terminal at a corner joined to the land at the corner described above may have a wiring structure not having a function as a signal line through which an electric signal passes between inside and outside of the element.

Furthermore, in this first aspect, the above-described light detection unit may output an electric signal according to light from the above-described stress light emitting body as a result of the above-described detection.

Furthermore, in this first aspect, a stress detection unit configured to detect stress in the above-described land on the basis of a detection result in the above-described light detection unit may be further included.

Furthermore, in this first aspect, the above-described stress detection unit may detect the above-described stress by comparing a detection result in the above-described light detection unit with a predetermined threshold value.

Furthermore, in this first aspect, the above-described stress detection unit may detect the above-described stress when a detection result of the above-described light detection unit changes.

Furthermore, in this first aspect, a holding unit configured to hold a detection result of the above-described light detection unit may be further included, and the above-described stress detection unit may detect a change in a detection result of the above-described light detection unit by comparing a detection result of the above-described light detection unit with a detection result held by the holding unit.

Furthermore, in this first aspect, a plurality of the above-described light detection units may be arranged between the above-described base material unit and the above-described land, and the above-described stress detection unit may detect the above-described stress on the basis of detection results of the above-described plurality of light detection units.

Furthermore, in this first aspect, a damage detection unit configured to detect damage of a joint part between the above-described terminal and the above-described land on the basis of the above-described detected stress may be further included.

Furthermore, in this first aspect, the above-described land may be bonded to a terminal of the element to be joined to the terminal.

Furthermore, in this first aspect, the above-described land may be arranged in a recess formed in the above-described base material unit.

According to the first aspect of the present disclosure, an effect is provided that light emission of the stress light emitting body arranged in the land is detected. Detection of stress in the joint part between the terminal and the land is assumed.

A second aspect of the present disclosure is a semiconductor package including: a substrate on which a semiconductor provided with a large number of terminals is mounted; and a stress light emitting body provided on a terminal side and/or a package side and configured to emit light when the terminal of the semiconductor and/or the package of the semiconductor described above is damaged, in which light emission of the above-described stress light emitting body is detected from outside.

Furthermore, in the second aspect of the present disclosure, the stress light emitting body may be a sheet-shaped stress light emitting body provided on an adhesive that bonds between the substrate side and a resin body and/or a glass body to be an external structure of the package.

Furthermore, in the second aspect of the present disclosure, a light beam emitted by light emission of the above-described stress light emitting body may include a wavelength other than a wavelength in a visible light band, such as a wavelength of an ultraviolet ray or a near infrared ray.

Furthermore, in the second aspect of the present disclosure, the above-described stress light emitting body may be provided only on a terminal at a corner portion among terminals of the semiconductor.

Furthermore, in the second aspect of the present disclosure, a light detector may be installed around the above-described package.

Furthermore, in the second aspect of the present disclosure, in the above-described stress light emitting body, any material may be usable from among: strontium aluminate ($SrAl_2O_4$:Eu) doped with europium and structurally controlled; zinc sulfide (ZnS:Mn) or barium calcium titanate ((Ba, Ca) $TiO_3$:Pr) doped with a transition metal or a rare earth; and calcium yttrium aluminate ($CaYAl_3O_7$:Ce).

Furthermore, according to the second aspect of the present disclosure, damage of the terminal of the semiconductor and/or the package of the semiconductor can be directly confirmed from outside by directly viewing light emission of the stress body from outside.

BRIEF DESCRIPTION OF DRAWINGS

FIGS. 6A and 6B are schematic views illustrating an example of light emission of a stress light emitting body according to the first embodiment of the present disclosure, in which FIG. 6A illustrates an example immediately after mounting, and FIG. 6B illustrates an example of a change in light emission when stress is applied.

MODE FOR CARRYING OUT THE INVENTION

Figure 1:
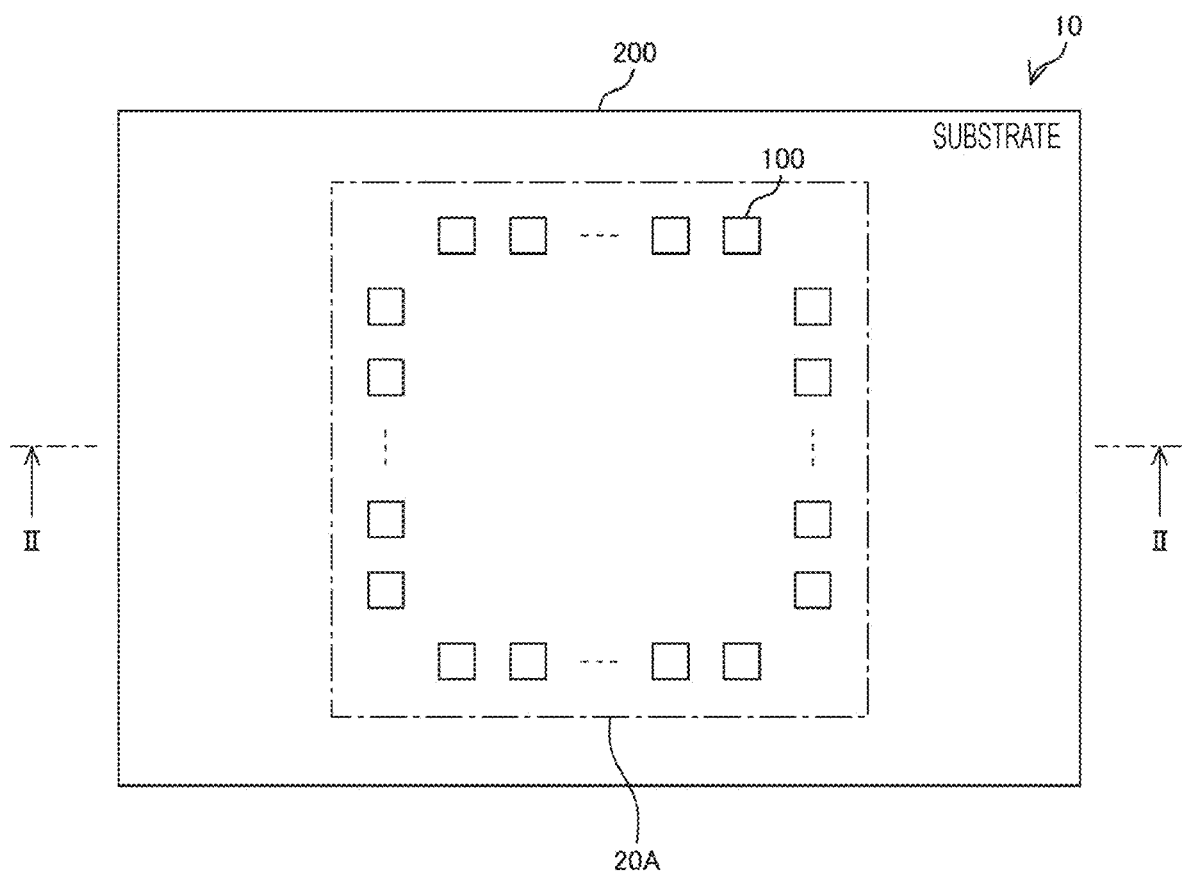
FIG. 1 is a schematic view illustrating a configuration example of a substrate according to a first embodiment of the present disclosure.

Next, embodiments for carrying out the present disclosure (hereinafter, referred to as embodiments) will be described with reference to the drawings. In the following drawings, the same or similar parts are denoted by the same or similar reference numerals. Furthermore, embodiments will be described in the following order.
1. First Embodiment
2. Second Embodiment
3. Third Embodiment (including experimental example)
4. Fourth Embodiment
5. Modification of fourth embodiment
6. Fifth Embodiment
1. First Embodiment

[Configuration of Substrate]

FIG. 1 is a view illustrating a configuration example of a substrate 10 of a semiconductor package according to an embodiment of the present disclosure. The substrate 10 in the figure includes a base material unit 200 and a land 100.

The base material unit 200 is a plate-shaped base material constituting the substrate 10. The land 100 is arranged on a surface of this base material unit 200. The land 100 is a conductor to which a terminal of an electronic component or the like is joined. The land 100 in the figure represents an example of a land formed in a rectangular shape. The land 100 is arranged according to the terminal of the electronic component to be mounted. This figure represents an example in which a plurality of lands 100 is arranged in a rectangular shape. Note that a plurality of electronic components can be mounted on the substrate 10. The lands 100 are electrically connected to each other by wiring lines (not illustrated). Note that the substrate 10 corresponds to a circuit substrate on which a surface-mounted semiconductor component, chip resistor, and the like are mounted, and a substrate of a semiconductor package on which a semiconductor chip is bare chip-mounted.

[Configuration of Substrate]

Figure 2:
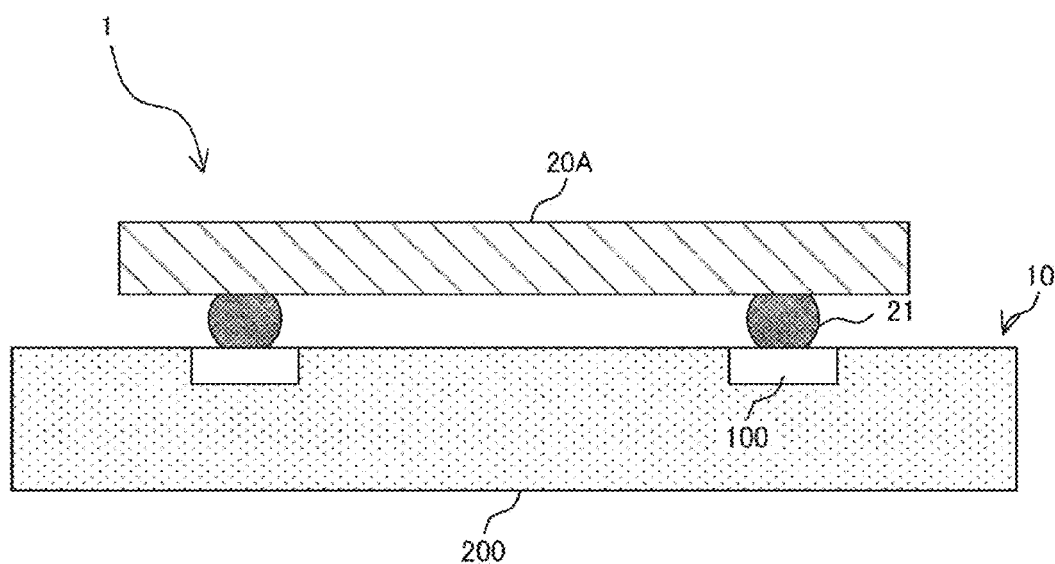
FIG. 2 is a cross-sectional view illustrating a configuration example of the substrate according to the first embodiment of the present disclosure.

FIG. 2 is a cross-sectional view illustrating a configuration example of the substrate 10 of a semiconductor package 1 according to an embodiment of the present disclosure. This figure is a view illustrating a state where an electronic component 20A is mounted on the substrate 10. The electronic component 20A includes a terminal 21. The terminal 21 in the figure is an example of being configured by a spherical metal such as a solder ball. The electronic component 20A is mounted on the substrate 10 by this terminal 21 being joined to the land 100 of the substrate 10. The substrate 10 in the figure represents an example of being formed in a shape in which the land 100 is embedded in the base material unit 200.

Note that, to the terminal 21 of the electronic component 20A, a lead terminal for surface mounting including copper (Cu) or the like can also be applied. Furthermore, an electrode of chip resistance can also be applied to the terminal 21. Note that the electronic component 20A is an example of an element described in the claims.

The electronic component 20A corresponds to a semiconductor element. This semiconductor element is configured by a member having a relatively small thermal expansion coefficient, such as a semiconductor chip. Whereas, the base material unit 200 is configured by a member having a relatively large thermal expansion coefficient, such as a resin. Therefore, different strains are individually generated in a case where a temperature changes. For example, in a case where a temperature of the substrate 10 and the electronic component 20A rises, the substrate 10 expands more than the electronic component 20A. For this reason, stress is generated at a connection portion between the substrate 10 and the electronic component 20A. Specifically, stress is applied to a joint part between the terminal 21 and the land 100. In a case where this stress is excessive, the joint part is damaged. Furthermore, when a temperature change that causes such distortion is repeated, damage to the joint part may progress to cause breakage of the joint part. In order to improve reliability of the substrate 10 on which the electronic component 20A is mounted, it is necessary to detect such damage of the joint part at an early stage.

[Configuration of Land Portion]

Figure 3:
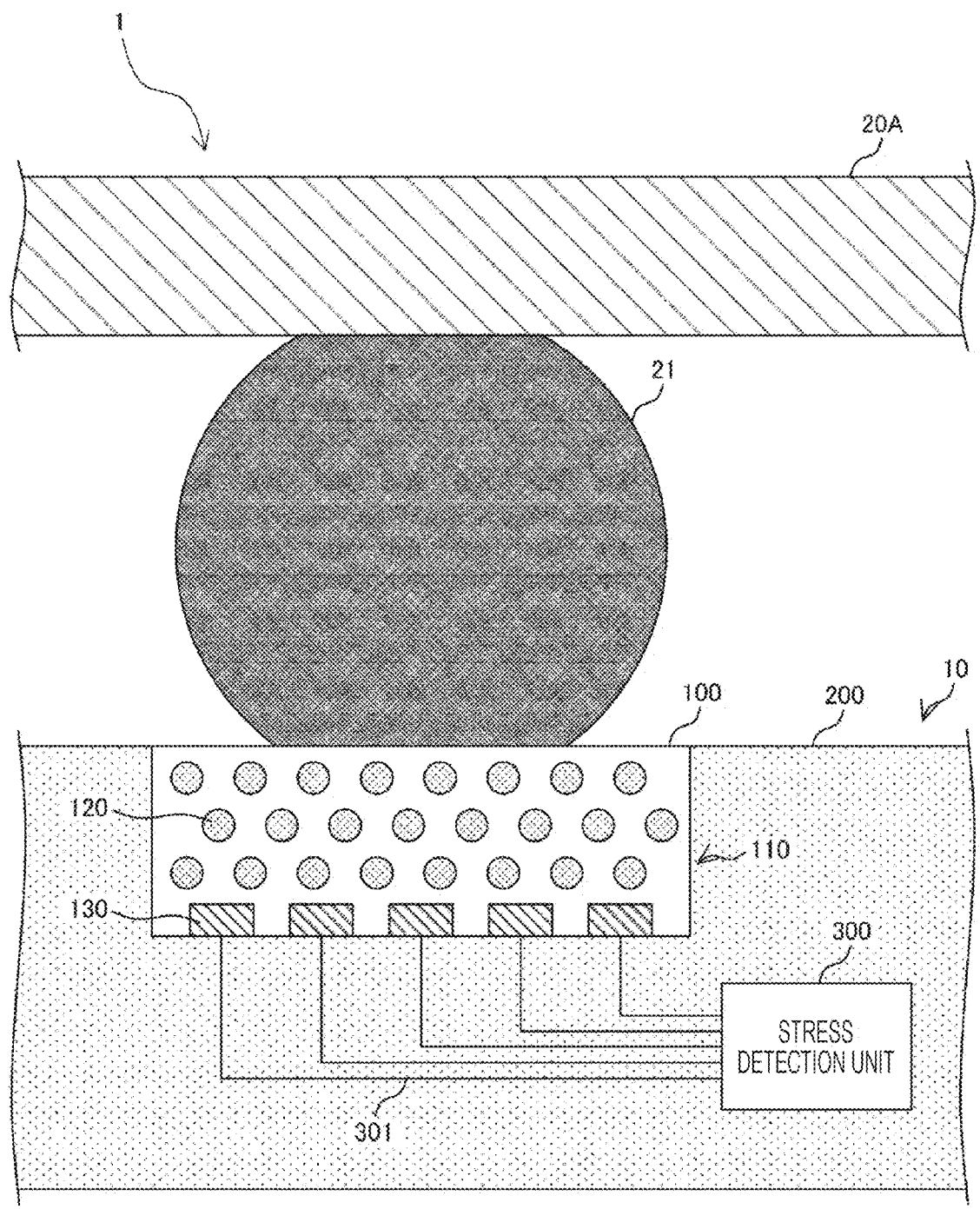
FIG. 3 is an enlarged cross-sectional view illustrating a configuration example of a land portion of the substrate according to the first embodiment of the present disclosure.

FIG. 3 is a cross-sectional view illustrating a configuration example of a portion of the land 100 of the substrate 10 of the semiconductor package 1 according to the embodiment of the present disclosure. This figure is an enlarged view of a region where the land 100 is arranged in FIG. 2. The substrate 10 includes the base material unit 200, the land 100, a light detection unit 130, and a stress detection unit 300.

As described above, the base material unit 200 is a plate-shaped base material constituting the substrate 10. This base material unit 200 includes an insulator, and the land 100 and a wiring line are arranged. This base material unit 200 can include, for example, resin or ceramic. Furthermore, the base material unit 200 can also include a composite material. Specifically, the base material unit 200 formed by impregnating a glass cloth with an epoxy resin can also be used.

As described above, the land 100 is a conductor to which a terminal of an electronic component or the like is joined. The land 100 in the figure can include a conductive resin. In this case, the land 100 and the terminal 21 can be joined by the terminal 21 being bonded with the resin constituting the land 100. As described later, the land 100 needs to transmit light, and a transparent resin is used as the resin constituting the land 100. Furthermore, the land 100 in the figure represents an example of being arranged in a recess 110 formed in the base material unit 200. The land 100 can be formed in a rectangular shape having a width of 1 mm, for example.

In the land 100, a stress light emitting body 120 is arranged. This stress light emitting body 120 emits light in accordance with this stress applied the self. For this stress light emitting body, for example, zinc sulfide (ZnS) doped with manganese (Mn) can be used. Furthermore, strontium aluminate ($SrAl_2O_4$) doped with europium (Eu) can also be used. Furthermore, barium calcium titanate ((Ba, Ca) $TiO_3$) doped with praseodymium (Pr) can also be used. Furthermore, calcium yttrium aluminate ($CaYAl_3O_7$) doped with cerium (Ce) can also be used. As the stress light emitting body 120, a material in which such a stress light emitting body is aggregated in a particle state can be used. The stress light emitting body 120 can be configured as, for example, a particle having a diameter of 200 nm. The land 100 in the figure represents an example of a configuration in which a plurality of stress light emitting bodies 120 is dispersed in a resin constituting the land 100.

In a case where stress is generated at the joint part between the terminal 21 and the land 100 due to a change in ambient temperature or the like, the stress light emitting body 120 emits light. By detecting this light emission, the stress in the joint part can be detected.

The light detection unit 130 is configured to detect light from the stress light emitting body 120. As the light detection unit 130, an optical sensor can be used. The light detection unit 130 in the figure is arranged at a bottom part of the recess 110. Furthermore, this figure represents an example in which a plurality of light detection units 130 is arranged. In this way, the light detection unit 130 can be arranged between the base material unit 200 and the land 100. The light detection unit 130 detects light and outputs a detection result. Specifically, the light detection unit 130 generates and outputs an electric signal corresponding to the emitted light. Hereinafter, this signal is referred to as a light detection signal. The light detection unit 130 in the figure outputs the light detection signal via a signal line 301.

The stress detection unit 300 detects stress on the basis of a detection result of the light detection unit 130. The stress detection unit 300 in the figure detects stress on the basis of light detection signals outputted from the plurality of light detection units 130. The stress detection unit 300 can be configured by a semiconductor element such as a microcomputer, and can be incorporated the base material unit 200. Details of the configuration of the stress detection unit 300 will be described later.

[Arrangement of Light Detection Unit]

Figure 4:
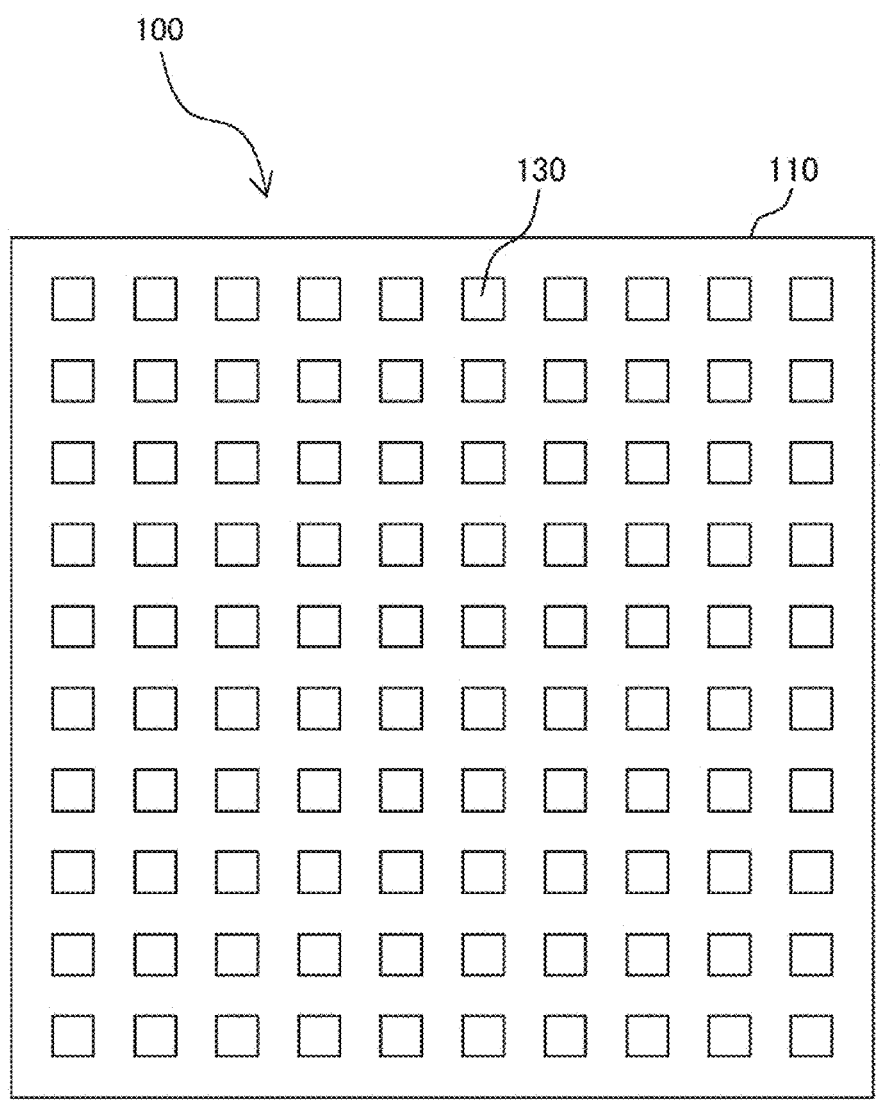
FIG. 4 is a schematic view illustrating an example of arrangement of a light detection unit according to the first embodiment of the present disclosure.

FIG. 4 is a view illustrating an example of arrangement of a light detection unit according to an embodiment of the present disclosure. This figure is a view illustrating an example in which the plurality of light detection units 130 is arranged in the recess 110 of the base material unit 200. As illustrated in the figure, the plurality of light detection units 130 can be arranged in a two-dimensional lattice pattern. Note that, in the figure, the light detection units 130 are arranged in ten rows and ten columns, but the number of the light detection units 130 is not limited.

[Configuration of Light Detection Unit]

Figure 5:
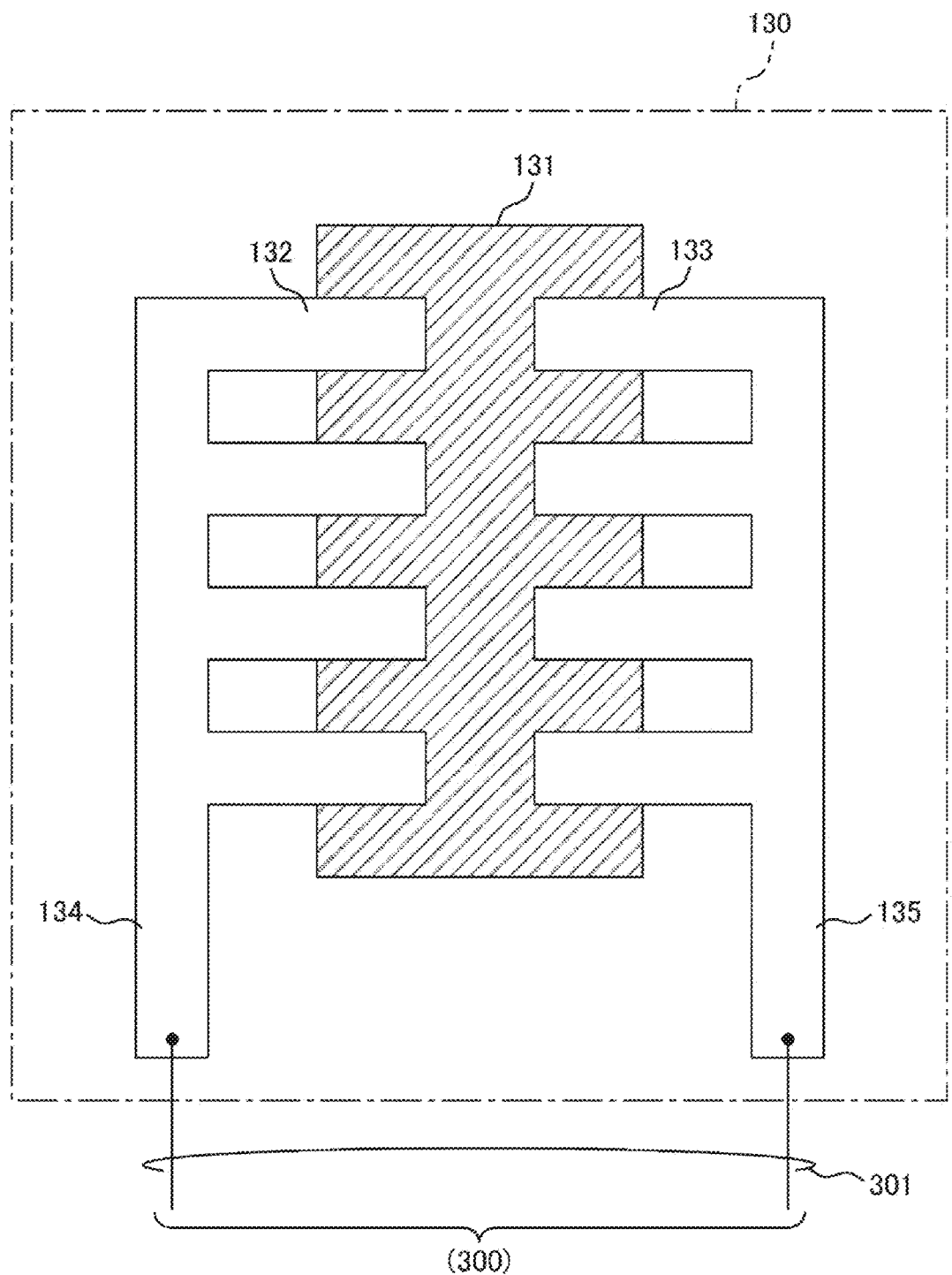
FIG. 5 is a schematic view illustrating a configuration example of the light detection unit according to the first embodiment of the present disclosure.

FIG. 5 is a view illustrating a configuration example of a light detection unit according to an embodiment of the present disclosure. This figure is a view illustrating a configuration example of the light detection unit 130. The light detection unit 130 in the figure includes a photoconductor 131 and electrodes 132 and 133.

Electrical conductivity of the photoconductor 131 changes in accordance with emitted light. As the photoconductor 131, for example, a photoconductor including graphene can be used. The photoconductor 131 in the figure is configured by a thin film of graphene.

The electrodes 132 and 133 are electrodes connected to the photoconductor 131. These electrodes 132 and 133 are arranged on a surface of the photoconductor 131 and are separately arranged at positions facing each other. The electrodes 132 and 133 can include, for example, gold (Au). Furthermore, a plurality of electrodes 132 and a plurality of electrodes 133 are arranged and connected to wiring lines 134 and 135, respectively. The wiring lines 134 and 135 are individually connected to the signal line 301.

When light is emitted on the light detection unit 130 in the figure, electrical conductivity of the photoconductor 131 between the electrodes 132 and 133 changes. At this time, by applying a voltage between the electrodes 132 and 133 via the signal line 301, a current according to the change in electrical conductivity can be detected. Specifically, when light is emitted on the light detection unit 130 in the figure, the electrical conductivity of the photoconductor 131 increases, and the current flowing between the electrodes 132 and 133 increases. By detecting the increase in the current, the emitted light can be detected. This current corresponds to the light detection signal described above.

Figure 6A:
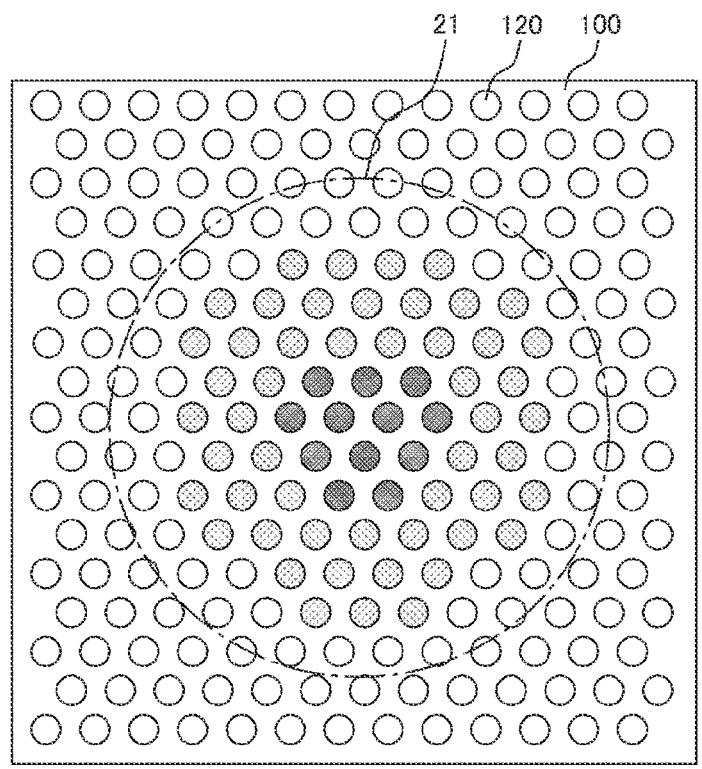
Figure 6B:
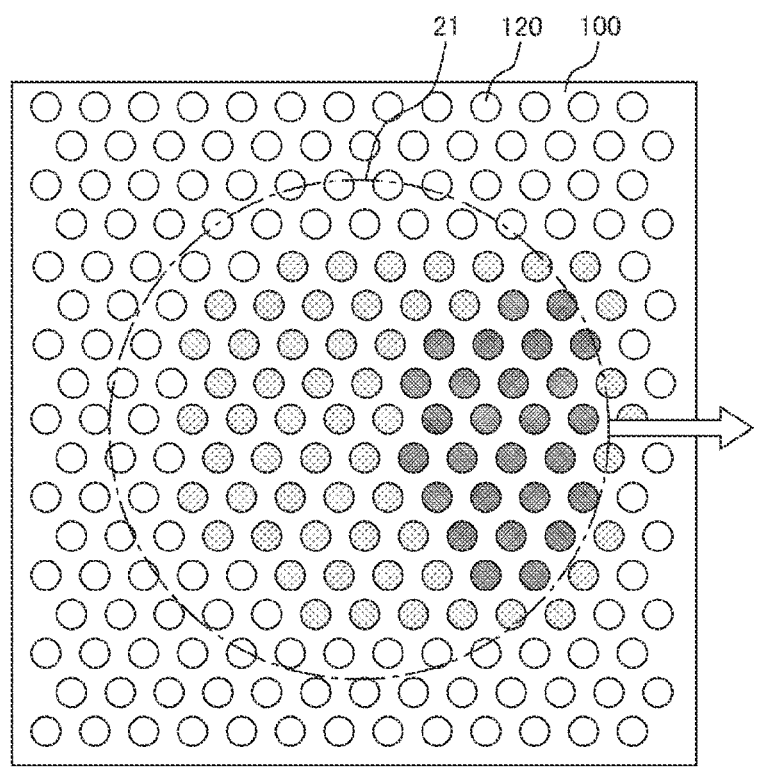

[Light emission of stress light emitting body] FIGS. 6A and 6B are views illustrating an example of light emission of a stress light emitting body according to an embodiment of the present disclosure. This figure is a view illustrating a state of light emission of the stress light emitting body 120 when stress is applied to a connection part between the terminal 21 and the land 100. In the figure, a solid-line rectangle represents the land 100. A solid-line circle represents the stress light emitting body 120, and hatching inside the circle represents intensity of light emission of the stress light emitting body 120. As a density of the hatching is higher, higher intensity of the light emission is represented. Furthermore, a chain-line circle represents the terminal 21 joined to the land 100.

FIG. 6 is a view illustrating a state of the land 100 immediately after the electronic component 20A is mounted. Since the terminal 21 is spherical, stress is strongly applied to a central portion of a region where the terminal 21 is joined. Therefore, the stress light emitting body 120 arranged in the central portion of the region where the terminal 21 is joined strongly emits light.

FIG. 6B is a view illustrating an example of a case where distortion occurs in the substrate 10 and the electronic component 20A, and stress is applied to a joint part between the terminal 21 and the land 100. A hollow arrow in FIG. 6B indicates a direction of the stress. As illustrated in FIG. 6B, the stress is applied in a right direction of the page, which increases the number of stress light emitting bodies 120 that strongly emit light. Furthermore, positions of the stress light emitting bodies 120 that emit light shift in the right direction. By capturing such a change in light emission of the stress light emitting bodies 120, it is possible to detect a change in the stress in the joint part between the terminal 21 and the land 100.

[Configuration of Stress Detection Unit]

Figure 7:
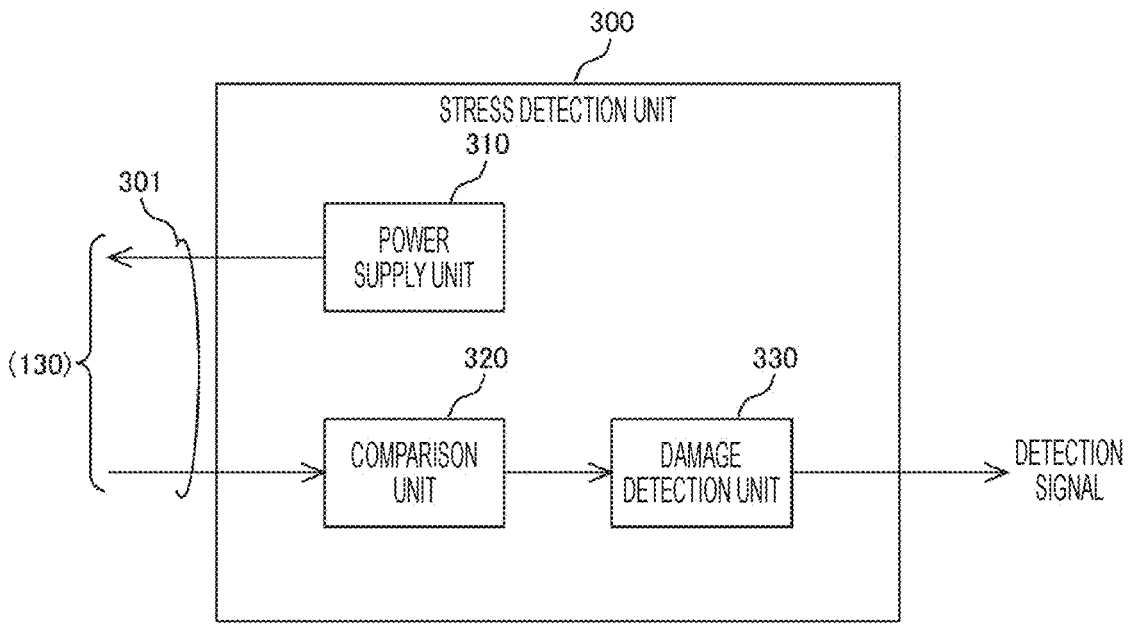
FIG. 7 is a schematic diagram illustrating a configuration example of a stress detection unit according to the first embodiment of the present disclosure.

FIG. 7 is a diagram illustrating a configuration example of a stress detection unit according to the first embodiment of the present disclosure. The stress detection unit 300 in the figure includes a power supply unit 310, a comparison unit 320, and a damage detection unit 330.

The power supply unit 310 supplies power to the light detection unit 130. This power supply unit 310 can be configured by a constant voltage power supply. The power supply unit 310 applies a power supply voltage to any one of the wiring lines 134 and 135 described in FIG. 5, for example, the wiring line 135 via one of two signal lines 301. In this case, the wiring line 134 is connected to the comparison unit 320 described later, via another one of the signal lines 301. In a case where the plurality of light detection units 130 is arranged as described in FIG. 3, the power supply unit 310 is commonly connected to the signal lines 301 connected to the individual light detection units 130.

The comparison unit 320 detects stress by comparing a light detection signal from the light detection unit 130 with a predetermined threshold value. This comparison unit 320 can detect stress in a case where the light detection signal is larger than a predetermined threshold value. Note that, in a case where the plurality of light detection units 130 is arranged, the comparison unit 320 individually compares each of the light detection signals from the plurality of light detection units 130 with the threshold value.

The damage detection unit 330 detects damage of the joint part between the terminal 21 and the land 100 on the basis of stress detected by the comparison unit 320. The damage detection unit 330 can detect damage when the comparison unit 320 detects stress. Furthermore, when the plurality of light detection units 130 is arranged, the damage detection unit 330 can also detect damage on the basis of the number of light detection units 130 corresponding to the detected stress. Furthermore, the damage detection unit 330 can also detect damage on the basis of an area occupied by the light detection unit 130 corresponding to the detected stress.

Figure 8:
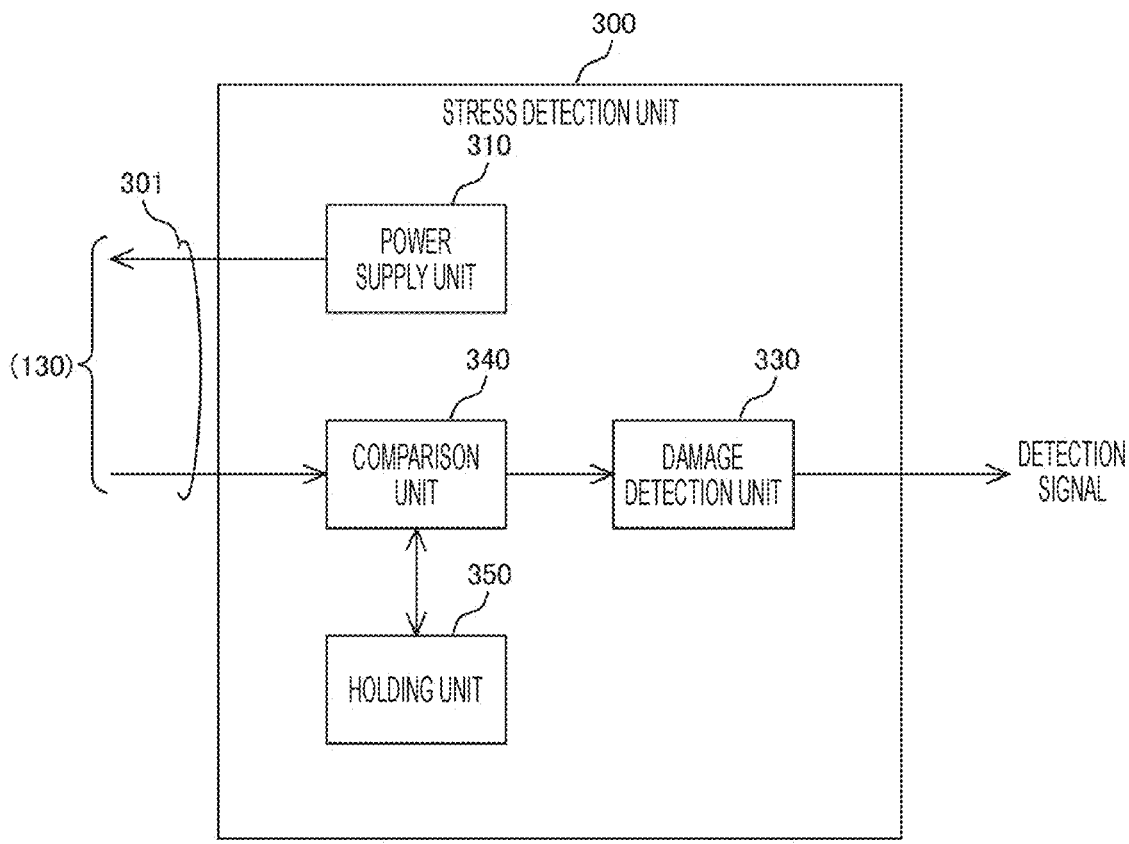
FIG. 8 is a schematic diagram illustrating a configuration example of a stress detection unit (a modification of the stress detection unit according to the first embodiment) according to a second embodiment of the present disclosure.

The damage detection unit 330 outputs a detection signal to outside when damage is detected. Furthermore, the damage detection unit 330 can also directly output stress detected by a comparison unit 340 (FIG. 8). In this case, a distribution of the stress in the land 100 can be displayed as an image. By arranging the stress detection unit 300, it is possible to confirm damage of the substrate 10 incorporated the electronic device or the semiconductor package, from outside. Furthermore, the damage of the substrate 10 can be detected even during an operation of the electronic device or the like.

Action and Effect

As described above, in the substrate 10 according to the embodiment of the present disclosure, by detecting light emitted from the stress light emitting body 120 arranged in the land 100 by using the light detection unit 130 arranged at the bottom part of the land 100, stress in the joint part between the terminal 21 and the land 100 can be detected. As a result, it is possible to detect damage of the joint part between the terminal 21 and the land 100.

2. Second Embodiment

In the substrate 10 of the above-described first embodiment, the stress is detected by comparing the light detection signal with the predetermined threshold value, in the stress detection unit 300. Whereas, a substrate 10 according to a second embodiment of the present disclosure is different from the above-described first embodiment in that stress is detected by detecting a change in a light detection signal.

[Another Configuration of Stress Detection Unit]

FIG. 8 is a diagram illustrating a configuration example of a stress detection unit according to the second embodiment of the present disclosure. This figure is a diagram illustrating a configuration example of a stress detection unit 300 similarly to FIG. 7. There is a difference from the stress detection unit 300 in FIG. 7 that a comparison unit 340 is arranged instead of the comparison unit 320, and a holding unit 350 is further provided.

The comparison unit 340 detects a change in stress when a light detection signal changes. In an initial state, this comparison unit 340 causes the holding unit 350 to hold a light detection signal from a light detection unit 130 as an initial value. Thereafter, the comparison unit 340 can detect a change in stress on the basis of a light detection signal outputted by the light detection unit 130 and the light detection signal held by the holding unit 350. Specifically, generation of new stress can be detected by detecting a difference between the light detection signal outputted from the light detection unit 130 and the light detection signal held by the holding unit 350. The newly detected stress can be compared with a predetermined threshold value.

Furthermore, the comparison unit 340 can also compare the light detection signal outputted from the light detection unit 130 with the light detection signal held in the holding unit 350, to detect a change (decrease) in stress in a case where the light detection signal outputted by the light detection unit 130 decreases. In a case where damage of a joint part between a terminal 21 and a land 100 progresses and the terminal 21 is detached from the land 100 or a surface of the land 100 is peeled off, stress in the region is reduced to substantially 0. Such damage such as detachment of the terminal 21 from the land 100 can be detected by detecting a decrease in the light detection signal outputted by the light detection unit 130. The detection of damage can be performed by the damage detection unit 330.

The holding unit 350 is configured to hold a light detection signal for each light detection unit 130. This holding unit 350 includes a memory or the like, and holds a light detection signal and outputs the held light detection signal to the comparison unit 340 on the basis of control of the comparison unit 340.

By including the holding unit 350 and detecting a change in the light detection signal, it is possible to detect progress of damage of the joint part between the terminal 21 and the land 100.

A configuration of the substrate 10 other than this is similar to the configuration of the substrate 10 described in the first embodiment of the present disclosure, and thus a description thereof will be omitted.

Action and Effect

As described above, the substrate 10 according to the second embodiment of the present disclosure can detect a change in stress by comparing a light detection signal held by the holding unit 350 with a newly detected light detection signal. As a result, it is possible to detect progress of damage of the joint part between the terminal 21 and the land 100.

3. Third Embodiment

Next, a semiconductor package 2 according to a third embodiment of the present disclosure will be described in detail with reference to FIGS. 9A, 9B, and 10. Note that, in the present embodiment, the same parts as those in the first and second embodiments are denoted by the same reference numerals, and a redundant description is avoided.

Figure 9A:
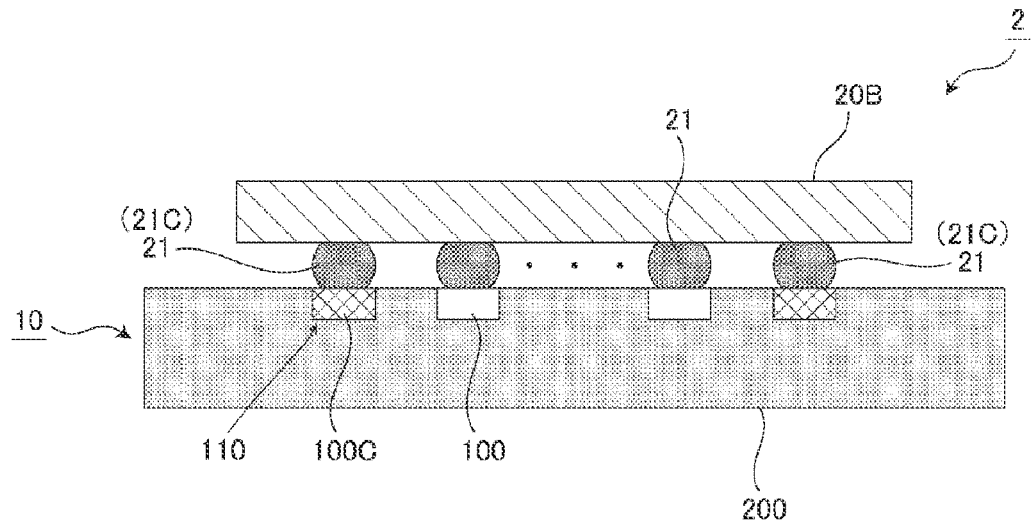
FIG. 9A is a schematic view illustrating a configuration example of a semiconductor package according to a third embodiment of the present disclosure.
Figure 9B:
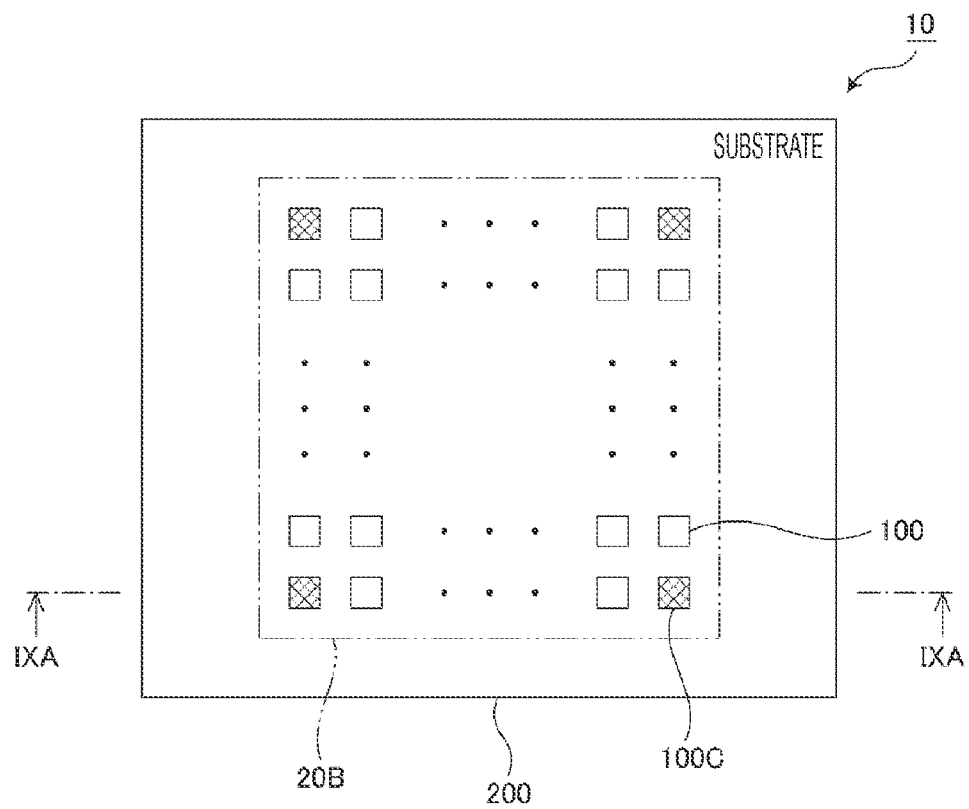
FIG. 9B is a schematic plan view of FIG. 9A.
Figure 10:
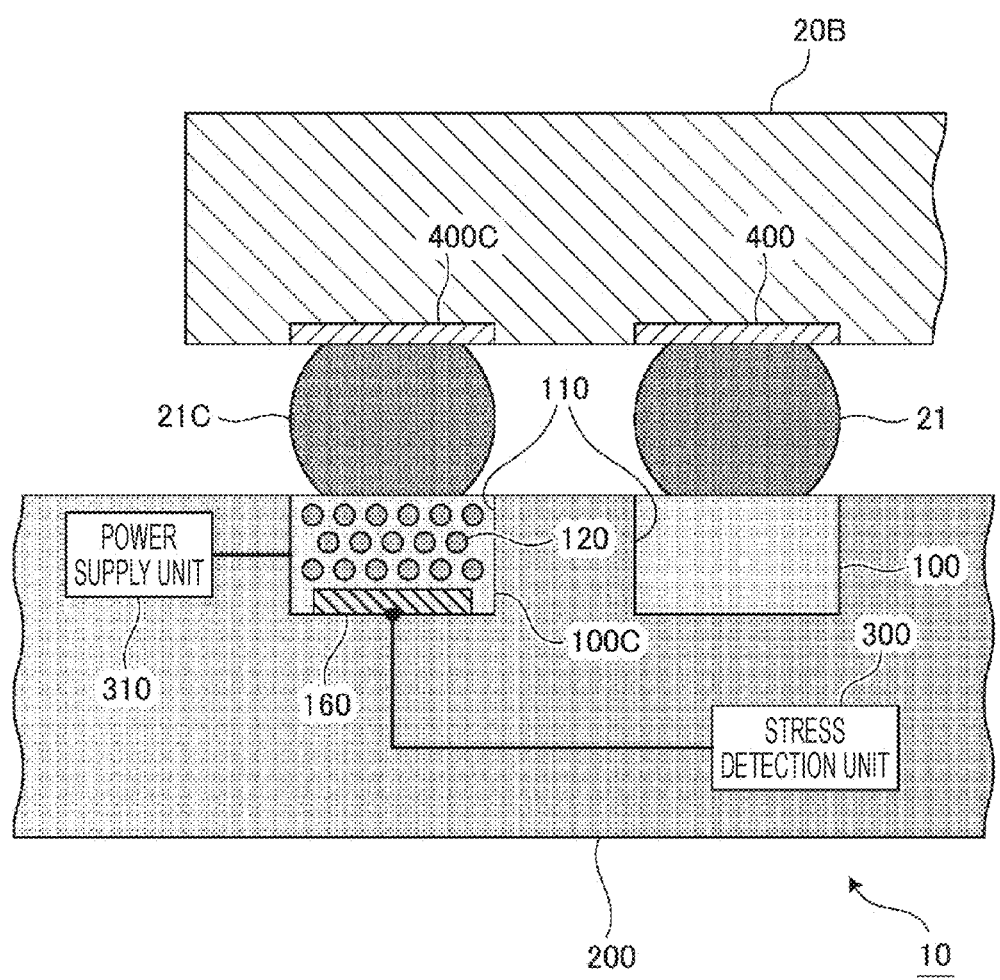
FIG. 10 is an enlarged schematic cross-sectional view illustrating a configuration example of a land and the like in a corner portion among lands of a substrate according to the third embodiment of the present disclosure.

FIGS. 9A and 9B illustrate the semiconductor package 2 according to the present embodiment. An electronic component 20B provided in the semiconductor package 2 of the present embodiment uses a package structure of a ball grid allay (BGA) type, and is connected to a land 100 on a substrate 10 side with a large number of terminals 21. Note that the electronic component 20B is an example of an element described in the claims.

Also in the present embodiment, a plurality of electronic components can be mounted on the substrate 10. Note that the substrate 10 may be a circuit substrate on which a surface-mounted semiconductor component, chip resistor, and the like are mounted, and a substrate of a semiconductor package on which a semiconductor chip is bare chip-mounted. Although details will be described later, other lands 100 excluding lands 100 (hereinafter, referred to as "corner lands 100C") at corners, for example, four corner portions, are electrically connected to each other by wiring lines not illustrated.

In the semiconductor package 2 of the present embodiment, on the basis of findings obtained from an experimental example described later, unlike the first embodiment, stress light emitting bodies 150 are provided only in the corner lands 100C at four corner portions among the large number of lands 100 provided in a lattice pattern on the substrate 10. This is because it has been found that, in a case where damage such as a crack occurs in the terminals 21, the crack or the like is likely to occur first in a terminal 21 (hereinafter referred to as a "corner terminal 21C") connected to the corner land 100C. Furthermore, light detection units 160 are also installed inside the corner lands 100C at the four corners.

[Configuration of Terminal]

Among the large number of terminals 21 of the present embodiment, in particular, the corner terminal 21C has only a function of simply electrically energizing a power supply unit 310 with a constant voltage power supply having a configuration similar to that of the first embodiment, instead of connecting between the electronic component 20B side and the substrate 10 side. Therefore, this corner terminal 21C repeats energization in synchronization with ON/OFF of the power supply accompanying use of an electronic device provided with the semiconductor package 2. In other words, this corner terminal 21C is for predicting breakage of terminals 21 other than the corner terminal 21C. That is, the corner terminal 21C is not configured to function as a part of a signal line for exchange of data between the electronic component 20B and the substrate 10 side. Therefore, the corner terminal 21C is connected only to an electrode 400C inside the electronic component 20B, and is not connected by a wiring line to other functional units including other electrodes 400 inside the electronic component 20B.

[Configuration of land] Also in the land 100 of the present embodiment, as illustrated in FIGS. 9A and 9B, similarly to the first embodiment, a plurality of recesses 110 is provided in a lattice pattern on an upper surface of a base material unit 200, and the lands 100 and 100C are installed in these recesses 110. The lands 100 and 1000 are arranged according to the terminals 21 and 21C of the electronic component 20B to be mounted.

The corner land 100C is a conductor to which the corner terminal 21 is joined, and is installed in the recess 110 similarly to other lands 100. As a specific configuration of the corner land 100C, a conductive transparent resin body similar to that of the first embodiment is used, and the stress light emitting bodies 150 are mixed in a dispersed state. In the corner land 100C formed by a transparent conductive resin, electrical connection between with the corner terminal 21C can be made by performing thermocompression on the terminal 21C such as a solder ball.

Whereas, the lands 100 other than the corner lands 100C do not particularly need to include a conductive transparent resin. Other lands 100 can be formed by a metal having good conductivity such as gold (Au) or copper (Cu). Furthermore, similarly, the land 100 and the electrode of the electronic component 20B can be electrically connected by the terminal 21 such as a solder ball.

[Configuration of Stress Light Emitting Body]

In the stress light emitting body 150, by using a mechanoluminescence particle that emits light when a force is applied to an object or the like and the force is converted into light energy, a light emission phenomenon of the mechanoluminescence particle can be used, which similarly applies to the first embodiment. As the stress light emitting body 150 of the present embodiment, for example, a sheet-shaped one (hereinafter referred to as a "stress light emitting sheet") in which mechanoluminescence particles are mixed in a thin transparent conductive resin body can be used. Since the stress light emitting sheet is thinner than the stress light emitting body 150 of the bulk-shaped corner land 100C having a certain thickness, stress easily propagates directly. Furthermore, an optical distance until an internal light emission ray propagating to outside is also short as the stress light emitting sheet is thin, and an attenuation amount is small accordingly, so that the stress light emitting sheet can emit light with high intensity.

The stress light emitting body 150 is not necessarily installed in the corner land 100C. For example, the stress light emitting body 150 may be provided between an upper side of the corner terminal 21C and the electrode 400C side of the electronic component 20B. In this case, a stress light emitting sheet in which a stress light emitting body is mixed in a conductive transparent resin body can be used.

[Configuration of Light Detection Unit]

The light detection unit 160 can be configured by an appropriate photoelectric conversion means or the like that outputs an electric signal in accordance with a received light amount or received light intensity when receiving light emitted from the stress light emitting body 150. That is, as the light detection unit 160, an optical sensor that generates a predetermined electromotive current (a photocurrent or an electromotive force) when receiving light having a wavelength emitted from the stress light emitting body 150, for example, a photodiode, a phototransistor, or the like can be used, which similarly applies to the first embodiment. The light detection unit of the present disclosure only needs to be capable of detecting light having a wavelength emitted from the stress light emitting body.

The light detection unit 160 of the present embodiment is embedded in a bottom part of the recess 110 in which the corner land 100C of the base material unit 200, which is the substrate 10, is installed. As this light detection unit 160, a light detection unit having a configuration similar to that of the light detection unit 130 of the first embodiment illustrated in FIG. 5 can be used. Furthermore, the stress detection unit 300 as illustrated in FIG. 7 or 8 is connected for output signal processing of this light detection unit 160.

Note that the light detection unit 160 may not be installed as long as a light emission phenomenon of the stress light emitting body 150 in the corner land 100C can be directly visually recognized from outside the substrate 10. In this case, it is convenient to use a transparent material having high light transmittance also for the base material unit 200 constituting the substrate 10, in addition to forming the corner land 100C with a transparent resin body having high light transmittance. With such a configuration, the light emission phenomenon from the effective light emitting body 150 in the corner land 100C can be more reliably confirmed from outside the base material unit 200.

[Action and Effect]

Normally, in manufacturing the semiconductor package 2, when the terminal 21 such as a solder ball is connected to the land 100, a crimping force in a vertical direction acts on the terminal 21, and stress is easily applied to upper and lower parts of the terminal 21. According to the experimental example described later, it has been found that stress is likely to concentrate particularly on solder balls as terminals at corners.

Therefore, even in the semiconductor package 2 of the present embodiment, there is a strong tendency that the corner terminal 21C is damaged to have a crack first before other terminals 21, due to energization to the electronic component 20B many times. The stress concentrated on the damaged corner terminal 21C propagates to the stress light emitting body 150 in the corner land 100C to cause a light emission phenomenon. In this manner, when the stress light emitting body 150 in the corner land 100C emits light, the light detection unit 160 that has received the light outputs a light detection signal. Similarly to the first embodiment, the light detection signal generates and outputs an electric signal corresponding to intensity of emitted light. As a result, it is possible to detect that the corner terminal 21C is damaged.

For example, in a configuration in which the stress detection unit 300 similar to that in FIG. 7 is connected to the light detection unit 160, similarly to the first embodiment, damage of the substrate 10 incorporated in the electronic device or the semiconductor package can be confirmed from outside. Furthermore, even during an operation of the electronic component 20B or the like, damage of the substrate 10 can be detected.

Whereas, in a case where the stress detection unit 300 similar to that in FIG. 8 is connected to the light detection unit 160, similarly to the second embodiment, it is possible to detect progress of damage of the joint part between the terminal 21 and the land 100.

Moreover, in the present embodiment, the light detection unit 160 for detection of damage is installed only in the corner land 100C on the basis of findings from the experimental example described later. Therefore, the damage of the terminal 21 can be detected only with a minimum number of stress light emitting bodies 150 and light detection units 160 installed, and the cost can be reduced.

Moreover, in a case of a configuration in which light emission of the stress light emitting body 150 in the corner land 100C can be visually recognized from outside the base material unit 200, the light detection unit is not required. Therefore, there is an effect that the cost can be further reduced. In particular, if strong light emission can be achieved by using the stress light emitting sheet as the stress light emitting body 150, visual recognition from outside is easier and more reliable, which is convenient.

Moreover, in the present embodiment, the corner terminal 21C does not have any function as a signal line for exchange of data. In other words, the corner terminal 21C is not connected to other electrodes 400 or others inside the electronic component 20B by a wiring line. Therefore, even if the corner terminal 21C has breakage such as a crack, the electronic component 20B can be continuously used as it is.

Experimental Example

Note that the inventors of the present disclosure have conducted an experiment (hereinafter, referred to as an "experimental example") as a basis of the configuration according to the third embodiment described above. This experimental example will be described in detail with reference to FIGS. 11 and 12.

[Experimental Configuration]

Figure 11:
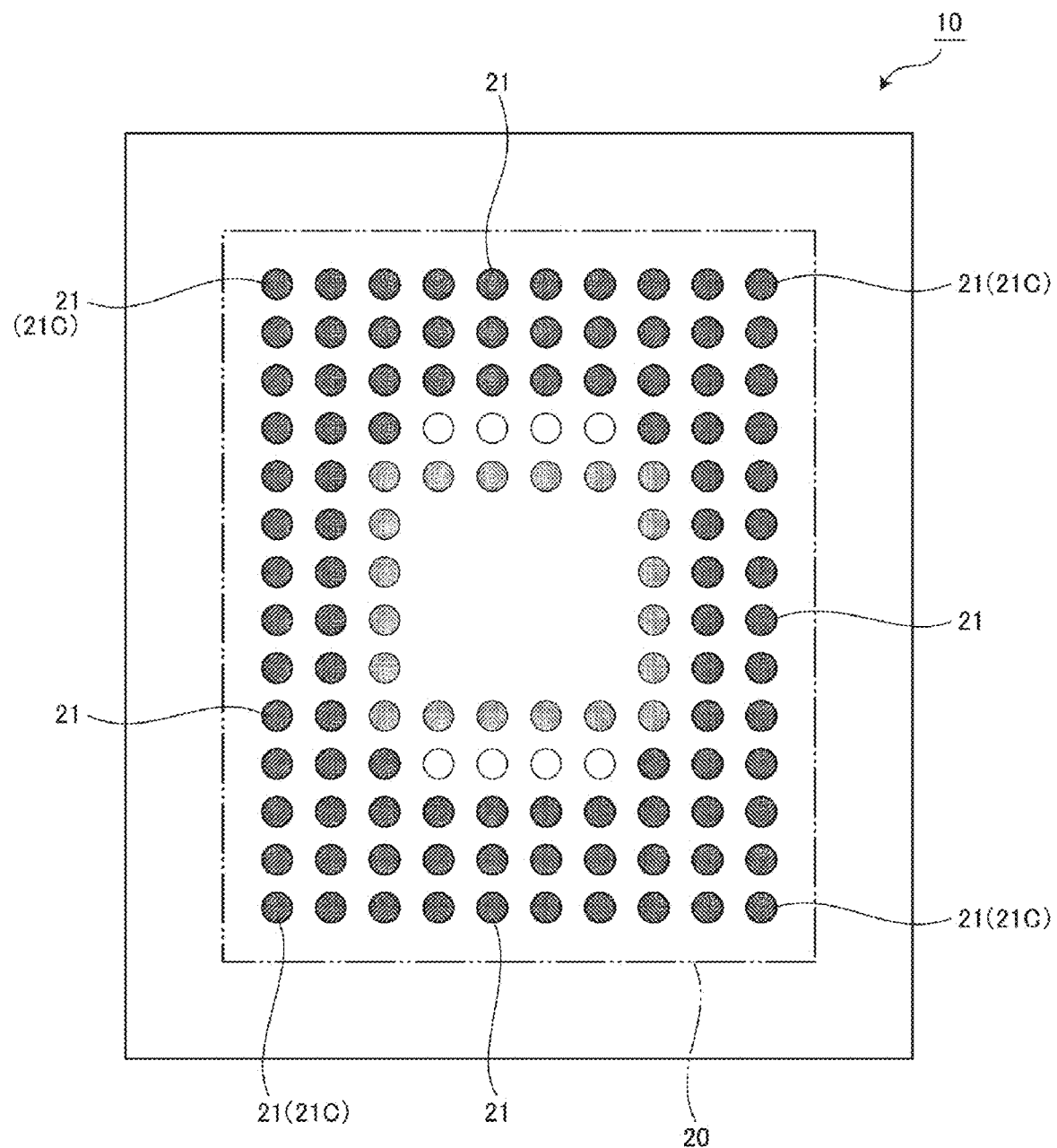
FIG. 11 is an explanatory view illustrating terminal arrangement of a semiconductor having a BGA structure used in an experimental example of the present disclosure used to obtain a basic configuration of the third and subsequent embodiments of the present disclosure.

FIG. 11 is a schematic view illustrating a state where a large number of terminals 21 (hereinafter, in this example, referred to as solder balls 21) such as solder balls provided in a semiconductor package 20 having a BGA structure similar to that used in the third embodiment are arranged in a lattice pattern on a substrate 10. In the present experimental example, it has been examined which solder ball 21 among the large number of solder balls 21 arranged and connected to individual lands (not illustrated) is particularly likely to have a crack when a current is applied to and cut off from an electronic component 20 many times. It is expected that upper and lower parts of the solder ball 21 are likely to be collapsed by application of a pressing force or a crimping force in a downward direction at the time of connection with the land. As a result, it is assumed that damage such as a crack and an atomic defect such as a Kirkendall void (Kirkendall boid) are likely to occur in the upper and lower collapsed portions.

Moreover, in addition, in a metal alloy or the like including a plurality of dissimilar metal atoms such as solder, for example, along with a thermal action received due to energization of the electronic component, an atomic lattice in the metal is likely to generate thermal vibration and diffusion, and a lattice defect is likely to be generated in a part of the atomic lattices. However, a diffusion rate of each metal atom varies depending on a type. Therefore, a microscopic atomic defect is likely to grow largely due to a deviation in diffusion rate at a joint site or the like between different kinds of metal atoms. When such a thermal history is repeatedly received, the atomic defect further progresses. As a result, there is a possibility that the above-described Kirkendall void or the like greatly grows by receiving a large number of thermal histories. Furthermore, when the generation of the defect of the atomic lattice greatly proceeds and the defect grows to a macroscopic level, there is a possibility that a crack is generated. For this reason, in the solder in which a crack, a Kirkendall void, and the like are generated, strength is reduced in these fragile sites, and concentration of stress leads to damage of the solder.

Figure 12:
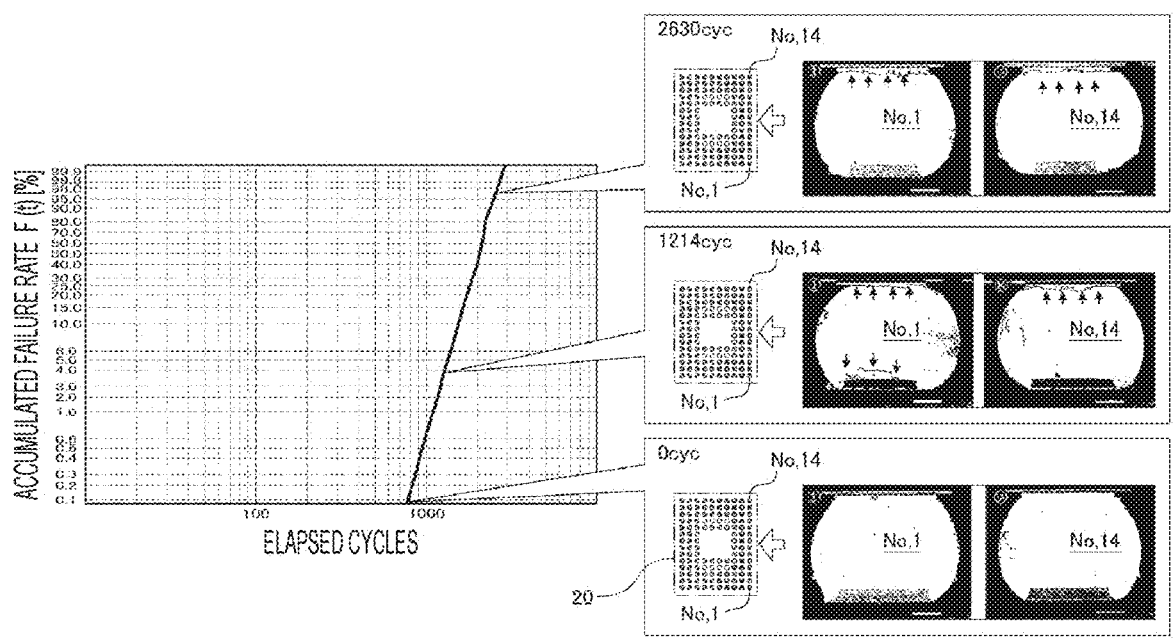
FIG. 12 is a graph showing a relationship between a failure rate of each terminal and the number of times of energization to each terminal performed in the experimental example of the present disclosure in each terminal of the semiconductor illustrated in FIG. 11, and an explanatory view illustrating experimental data obtained from the experimental example of the present disclosure for obtaining a failure frequency of each terminal arranged in a large number.

The experimental example described above has been uniquely conceived from such theoretical findings, and on the basis of this, the above-described experiment has been performed. A graph created on the basis of data obtained by the experiment at this time is illustrated in FIG. 12. The graph in the figure is a log-log graph in which a horizontal axis indicates a cumulative total number of energization (the number of cycles) when energization to the electronic component 20 is actually performed, and a vertical axis indicates an accumulated percentage (%) of a failure rate due to an occurrence of a crack and the like.

Furthermore, FIG. 11 schematically illustrates a specific occurrence situation of a failure portion obtained for each of the solder balls 21 arranged in a lattice pattern on the substrate 10. Note that, for these solder balls 21, the solder ball 21 at a location with a larger number of dots (darker color) indicates a higher resistance value (larger damage). That is, it is indicated that the number of occurrences (failure rate) of damage such as a crack is large due to concentrated application of the stress.

Furthermore, at any three points on the graph of FIG. 12, a sample photograph is also shown in which a crack generation site is captured as a specific cleavage. Each of the sample photographs shows a captured image of the solder balls 21 at corners of a lowermost right portion (No. 1) and an uppermost right portion (No. 14) among the large number of solder balls 21 arranged in a lattice pattern. In these sample photographs, the solder ball 21 is in a state of being collapsed upward and downward. This solder ball 21 has a lower part connected to a land and an upper part connected to an electrode of an electronic component.

[Experimental Results]

According to this experimental example, it has been found that the solder balls 21C at the corner portions of the four corners have a large number of occurrences (failure rate) of damage such as a crack in particular, among the solder balls 21 connected to the individual lands. This may be because stress tends to concentrate on the four corner portions of the semiconductor package 20. On the basis of the findings obtained from the experimental results, the configuration of the third embodiment has been conceived. That is, in the embodiment of the present disclosure, the stress light emitting body 150 is particularly installed only in the corner land 100C corresponding to the corner terminal 21C among the terminals 21 and the lands 100 arranged in a large number in a lattice pattern. Furthermore, by monitoring light emission from the stress light emitting body 150 attached inside the corner land 100C by using the light detection unit 160, damage to a terminal of an electronic component can be detected early and effectively, and a failure due to deterioration over time of the electronic component can be confirmed in advance.

4. Fourth Embodiment

Figure 13A:
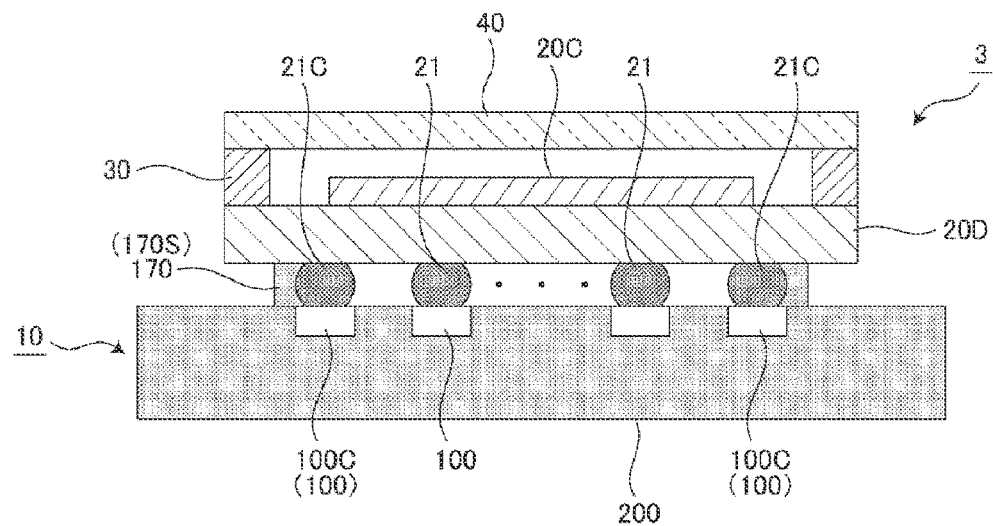
FIG. 13A is a schematic view illustrating a configuration example of a semiconductor package according to a fourth embodiment of the present disclosure.
Figure 13B:
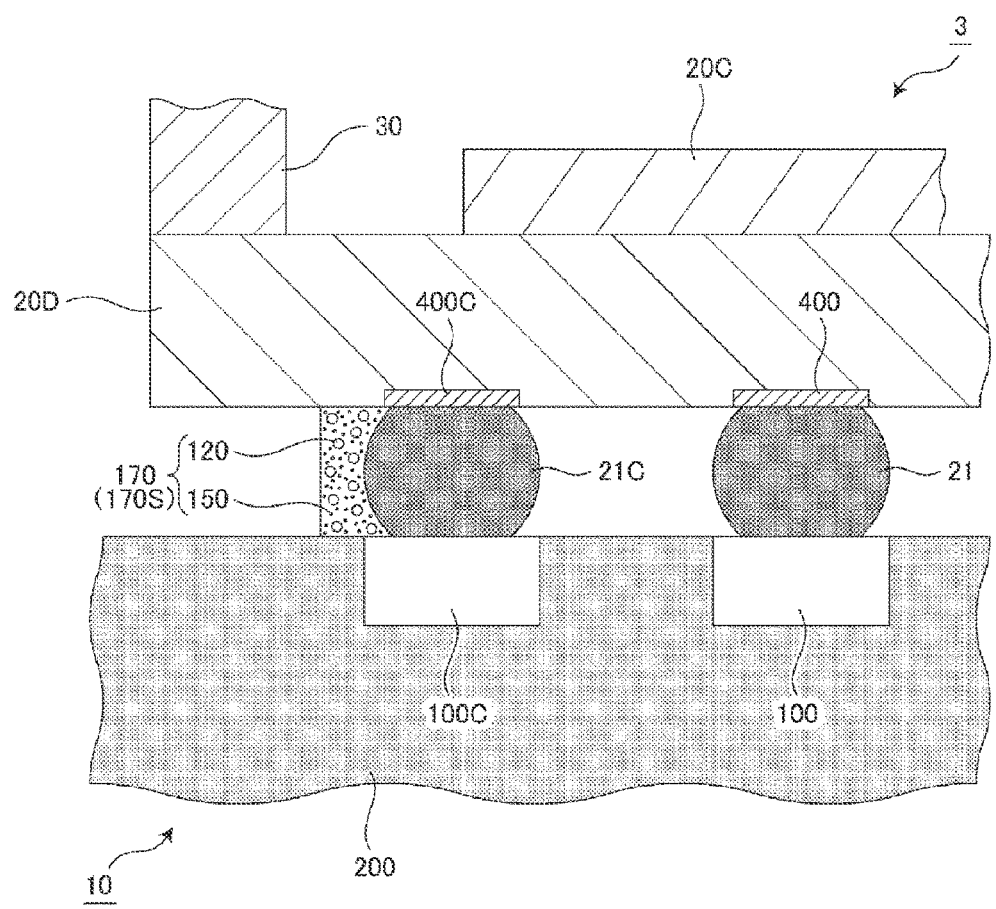
FIG. 13B is an enlarged cross-sectional view of a corner portion of FIG. 13A.

Next, a semiconductor package 3 according to a fourth embodiment of the present disclosure will be described in detail with reference to FIGS. 13A and 13B. Note that, in the present embodiment, the same parts as those in the first to third embodiments are denoted by the same reference numerals, and a redundant description is avoided. Note that the semiconductor package 3 of the present embodiment is similar to that of the previous embodiment in that an electronic component 20C having a BGA structure is used. However, unlike these embodiments, an upper surface of an interposer 20D on which the electronic component 20C is mounted is sealed with a side plate 30 and a ceiling plate 40.

Moreover, the semiconductor package 3 of the present embodiment is different from the semiconductor packages 1 and 2 according to the first to third embodiments in that a conductive transparent resin body 150 (hereinafter, referred to as a stress light emitting block 170) in which stress light emitting bodies 120 (see FIG. 13B) are dispersed and mixed is particularly provided to corner terminals 21C at four corners among terminals 21 for connection with a large number of lands 100 provided on a substrate 10, and a light detection unit is not installed.

The stress light emitting block 170 of the present embodiment is provided on an outer surface of the corner terminal 21C so as to be observable not from inside a corner land 100C but from outside. That is, it is not necessary to provide a conductive transparent resin body or a stress light emitting body inside the corner land 100C. Note that a stress light emitting body provided at the corner terminal 21C may have a configuration in which the stress light emitting body is dispersed and mixed in a transparent resin body having conductivity and formed in a sheet shape (this is referred to as a stress light emitting sheet 170S) instead of being provided as a block form as described above.

In a case where the stress light emitting sheet 170S is attached instead of the stress light emitting block 170 of the present embodiment, a configuration having strong intensity can be achieved, and it is more convenient to visually recognize with the naked eye. Therefore, the stress light emitting block 170 and the stress light emitting sheet 170S preferably emit light having a wavelength in a visible light region. By using the stress light emitting block 170 or the stress light emitting sheet 170S having such a configuration, it is possible to easily confirm that damage such as a crack has occurred in the corner terminal 21C, by directly visually recognizing a light emission phenomenon from outside.

[Action and Effect]

In the present embodiment, the stress light emitting block 170 is attached only to the corner terminal 21C, which is susceptible to damage such as a crack, that is, a terminal at the corner facing outside, on the basis of the findings in the above-described experimental example. Therefore, the light emission phenomenon can be visually recognized directly from outside with respect to the corner terminal 21C, which is highly likely to be broken first among the terminals. Furthermore, the terminal that should be visually recognized is located on an outermost portion, which is particularly easily found first, in the terminals arranged in a lattice pattern. Accordingly, breakage of the corner terminal 21C can be easily and reliably confirmed from outside. Note that, in a case where the stress light emitting body is of a type that emits light having a specific wavelength outside visible light (for example, a near infrared ray, a near ultraviolet ray, and the like), it is only required to prepare a light detection unit configured to detect light in the wavelength region in the semiconductor package 3 or in the vicinity thereof.

Therefore, according to the present embodiment, the stress light emitting block 170 or the stress light emitting sheet 170S is only required to be directly attached to an outer surface of the corner terminal 21C instead of inside the lands 100 and 100C. Therefore, installation work is simple, and the cost can be greatly reduced. In particular, in a case where a light emission ray from the stress light emitting block 170 or the stress light emitting sheet 170S is visible light, the light detection unit is not required, so that the cost can be further reduced.

Moreover, according to the present embodiment, when it is necessary to confirm damage such as a crack of the terminal 21 after manufacturing the electronic device including the semiconductor package 3, it is only required to attach the stress light emitting block 170 or the stress light emitting sheet 170S to the terminal 21. Therefore, even if the stress light emitting block 170 or the stress light emitting sheet 170S is installed later, an occurrence of damage such as a crack can be detected.

5. Modification of Fourth Embodiment

Figure 14A:
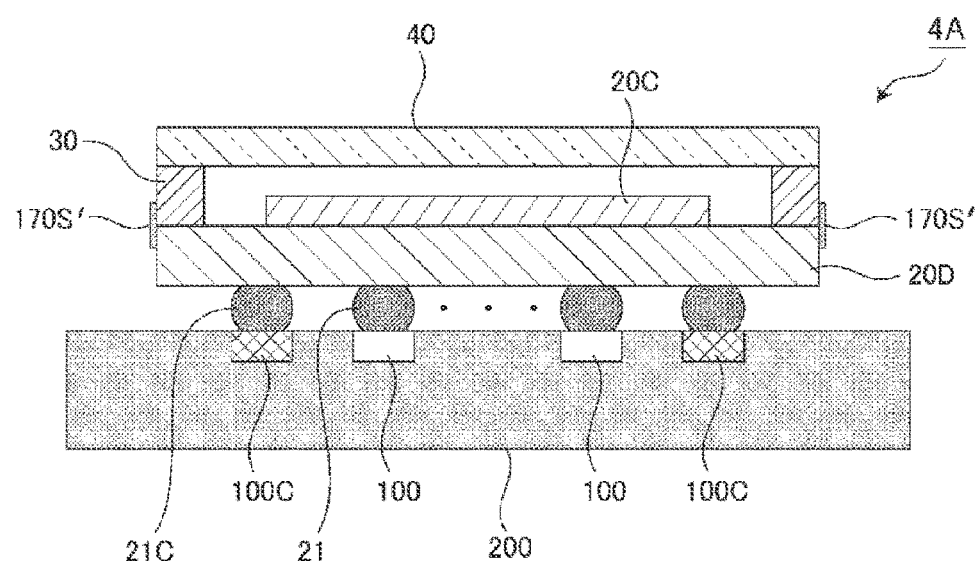
FIG. 14A is a schematic view illustrating a first modification of the semiconductor package according to the fourth embodiment of the present disclosure.
Figure 14B:
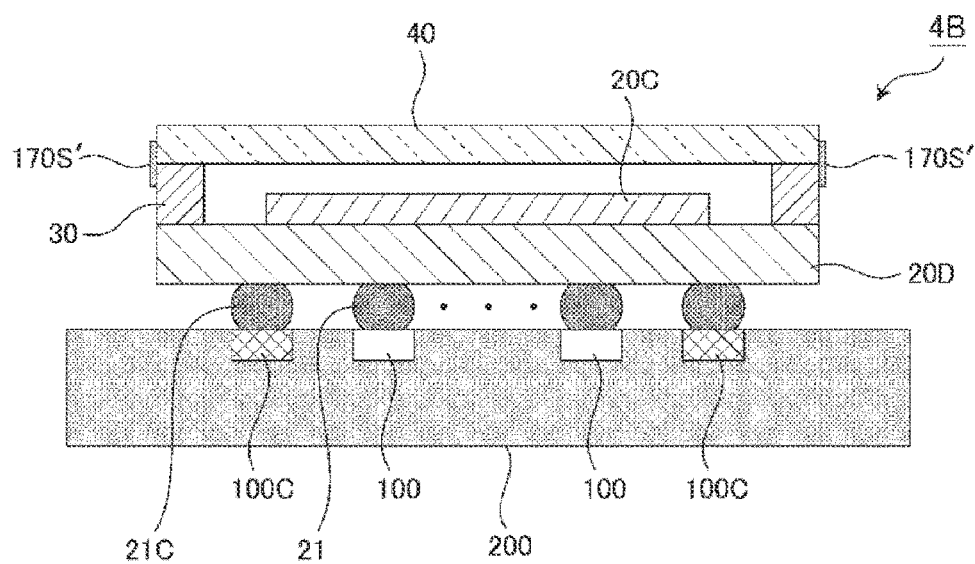
FIG. 14B is a schematic view illustrating a second modification of the semiconductor package according to the fourth embodiment of the present disclosure.

Next, semiconductor packages 4A and 4B according to a modification of the fourth embodiment of the present disclosure will be described in detail with reference to FIGS. 14A and 14B. Note that, in the present embodiment, the same parts as those of the first to fourth embodiments (particularly, the fourth embodiment) are denoted by the same reference numerals, and a redundant description is avoided.

[Configuration]

In the semiconductor packages 4A and 4B, similarly to the fourth embodiment, a side wall plate 30 including an appropriate plastic resin material is fixed, with an adhesive, to an upper surface of an interposer 20D on which an electronic component 20C is mounted. Moreover, to a top surface of the side wall plate 30, a ceiling plate 40 including a transparent sealing material such as a glass body is fixed with an adhesive.

In general, an adhesive is likely to cause damage such as cleavages, crazes, and cracks (solvent cracks) due to a temperature and environmental change, and the like. Furthermore, for example, in a case where iodine or the like is added to the adhesive, there is a possibility that the additive enters from an adhesion interface into an object that is to be bonded, and a defect occurs at the interface or the like to cause breakage, a cleavage, or the like. Therefore, it is preferable not to include a component that is likely to cause a defect as a component of the adhesive.

In the present disclosure, in a modification (hereinafter, a first modification) illustrated in FIG. 14A, in order to detect a cleavage, damage, or the like of an adhesive (not illustrated) between the interposer 20D and the side plate 30, a stress light emitting sheet 170S' similar to that described in the fourth embodiment is attached outside the adhesive between the interposer 20D and the side plate 30. Also in a modification (hereinafter, a second modification) shown in FIG. 14B, a similar stress light emitting sheet 170S' is attached outside the adhesive between the side wall plate 30 and the ceiling plate 40.

Note that the stress light emitting sheet 170S' of the first and second modifications is obtained by dispersing and mixing a stress light emitting body in a transparent resin body formed in a sheet shape, for example, and does not need to be conductive as the stress light emitting sheet 170S described in the fourth embodiment. Furthermore, also in the first and second modifications described above, the light detection unit is not provided similarly to the case of the fourth embodiment, but a light detector may be provided around the semiconductor packages 4A and 4B to detect light emitted from the stress light emitting sheet. Note that, a configuration may be adopted in which the entire electronic component 20C is molded and sealed with a plastic resin instead of the side wall plate 30 and the ceiling plate 40 as in the configuration of the present embodiment. In this case, the stress light emitting sheet can be attached to a boundary between the plastic resin and the interposer.

[Action and Effect]

Therefore, according to the first and second modifications, in the stress light emitting sheet 170S' described above, in a case where damage such as a cleavage and a crack occurs at an interface or the like in accordance with a change in temperature, environment, or the like of each adhesive, strong stress is generated in the stress light emitting sheet 170S' attached to the adhesive to cause emission of visible light. Therefore, an observer can observe and confirm the light beam with the naked eye from outside.

Furthermore, in the first and second modifications, since the light detection unit is not provided, the cost can be reduced accordingly. Furthermore, in any of the modifications, since the stress light emitting sheet 170S' is not embedded in the lands 100 and 100C, manufacturing is easy and the cost can be reduced accordingly. Moreover, similarly to the fourth embodiment, the stress light emitting sheet 170S' can be attached later. Moreover, installation work of the stress light emitting sheet 170S' can be easily and simply performed.

6. Fifth Embodiment

Figure 15:
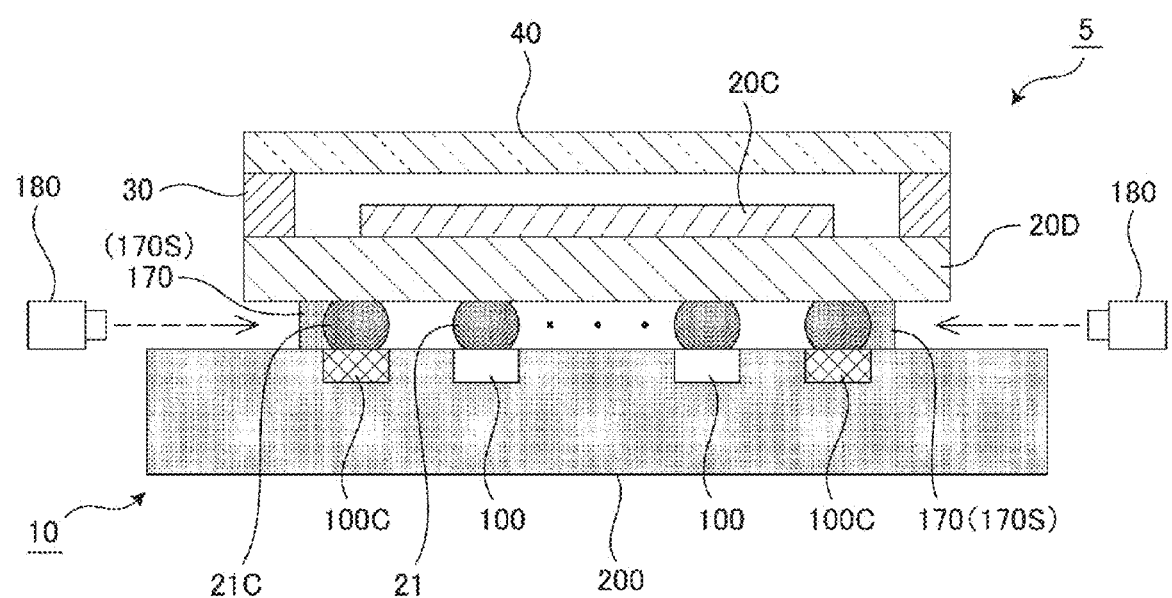
FIG. 15 is a schematic view illustrating a configuration example of a light detection unit according to a fifth embodiment of the present disclosure.

Next, a semiconductor package 2 according to a fifth embodiment of the present disclosure will be described in detail with reference to FIG. 15. Note that, in the present embodiment, the same parts as those in the first to fourth embodiments are denoted by the same reference numerals, and a redundant description is avoided.

The semiconductor package 5 of the present embodiment is different from the semiconductor package 3 of the fourth embodiment in that an image capturing means 180 is installed as a means for detection of light emission from a stress light emitting sheet 170S, instead of confirmation with the naked eye.

As the image capturing means 180, a video camera, a digital camera, or the like using an individual imaging element such as a charge coupled device image sensor (CCD image sensor) or a complimentary metal oxide image sensor (CMOS image sensor) can be used. Furthermore, an imaging signal outputted from the image capturing means 180 may be extracted to outside via a signal line and recorded by an image recording means or the like. Furthermore, this light emission detection means is not necessarily limited to the image capturing means 180 and the image recording means. Various light emission detection means such as a light detector can be applied, this light emission detection means may be installed around the semiconductor package.

[Action and Effect]

Therefore, according to the present embodiment, similarly to the fourth embodiment, the stress light emitting sheet 170S is attached to a corner terminal 21C, which is particularly susceptible to damage such as a crack, that is, an outermost terminal facing the outside. Therefore, for example, light emission emitted from the stress light emitting sheet 170S can be captured by the image capturing means 180 such as a video camera. Therefore, in a case of a configuration in which the captured image is recorded, even if the observer is not always observing the captured image, an abnormality such as damage of a terminal 21 can be easily confirmed at any time thereafter.

Finally, the description of each of the above-described embodiments is an example of the present disclosure, and the present disclosure is not limited to the above-described embodiments. For this reason, it is needless to say that various modifications can be made according to the design and the like without departing from the technical idea according to the present disclosure even if other than the individual embodiments described above.

Furthermore, the effects described in the present specification are merely examples and are not limited. Furthermore, there may be other effects.

Moreover, the application range of the present disclosure is not particularly limited to the substrate or the semiconductor package of the present disclosure. For example, in order to detect damage in a portion where damage is likely to occur in a steel frame portion of a bridge or a structure of concrete or the like of a tunnel, the stress light emitting body, the light detection unit, or the like of the present disclosure may be installed to detect the damage. Furthermore, in a surgical endoscope (including, for example, an optical endoscope and an electronic endoscope), the stress light emitting sheet or the like of the present disclosure may be provided at a site that is likely to be damaged by multiple sterilization operations by an autoclave, and the presence or absence of damage may be detected in advance prior to sterilization and disinfection work. Moreover, in order to be able to detect a failure in each component in advance before a vehicle inspection or the like, the stress light emitting sheet, the light detection unit, or the like of the present disclosure may be installed in advance on a component that is likely to be damaged.

Note that, the drawings in the above-described embodiments are schematic, and dimensional ratios and the like of the individual units do not necessarily coincide with actual ones. Furthermore, naturally, even between the drawings, there is included a part in which a relation or a ratio of dimensions of those may differ from each other.

Furthermore, the processing procedure described in the embodiment described above may be regarded as a method having a series of these procedures, and may be regarded as a program for causing a computer to execute the series of procedures, or a recording medium storing the program. As this recording medium, for example, a compact disc (CD), a digital versatile disc (DVD), a memory card, and the like can be used.

Note that the present technology can also have the following configurations.

(1) A substrate including:
a base material unit;
a land arranged with a stress light emitting body that emits light in accordance with stress, the land including a transparent member, arranged in the base material unit, and joined with a terminal of an element; and
a light detection unit arranged between the base material unit and the land and configured to detect light from the stress light emitting body.

(2) The substrate according to (1), in which the stress light emitting body is particularly arranged only in a land at a corner among a plurality of lands to which a plurality of terminals included in the element is joined.

(3) The substrate according to (1), in which a terminal at a corner joined to the land at the corner has a wiring structure not having a function as a signal line through which an electric signal passes between inside and outside of the element.

(4) The substrate according to (1), in which the light detection unit outputs an electric signal according to light from the stress light emitting body, as a result of the detection.

(5) The substrate according to (1), further including a stress detection unit configured to detect stress in the land on the basis of a detection result in the light detection unit.

(6) The substrate according to (5), in which the stress detection unit detects the stress by comparing a detection result in the light detection unit with a predetermined threshold value.

(7) The substrate according to (5), in which the stress detection unit detects the stress when a detection result of the light detection unit changes.

(8) The substrate according to (7), further including: a holding unit configured to hold a detection result of the light detection unit, in which
the stress detection unit detects a change in a detection result of the light detection unit by comparing a detection result of the light detection unit with a detection result held by the holding unit.

(9) The substrate according to (5), in which
a plurality of the light detection units is arranged between the base material unit and the land, and
the stress detection unit detects the stress on the basis of detection results of the plurality of the light detection units.

(10) The substrate according to (5), further including a damage detection unit configured to detect damage of a joint part between the terminal and the land on the basis of the detected stress.

(11) The substrate according to (1), in which the land is bonded to a terminal of the element to be joined to the terminal.

(12) The substrate according to (1), in which the land is arranged in a recess formed in the base material unit.

(13) A semiconductor package including:
a substrate on which a semiconductor provided with a large number of terminals is mounted; and
a stress light emitting body provided on a terminal side and/or a package side and configured to emit light when the terminal of the semiconductor and/or the package of the semiconductor is damaged, in which
light emission of the stress light emitting body is detected from outside.

(14) The semiconductor package according to (13), in which the stress light emitting body is a sheet-shaped stress light emitting body provided on an adhesive that bonds between the substrate side and a resin body and/or a glass body to be an external structure of the package.

(15) The semiconductor package according to (13), in which a light beam emitted by light emission of the stress light emitting body also includes a wavelength other than a wavelength in a visible light band, such as a wavelength of an ultraviolet ray or a near infrared ray.

(16) The semiconductor package according to (13), in which
the stress light emitting body is provided only at a terminal of a corner portion among terminals of the semiconductor, and
damage to the terminal is monitored using the stress light emitting body as a monitoring means.

(17) The semiconductor package according to (13), in which a light detector is installed around the package.

(18) The semiconductor package according to (13), in which, in the stress light emitting body, any material is usable from among: strontium aluminate ($SrAl_2O_4$:Eu) doped with europium and structurally controlled; zinc sulfide (ZnS:Mn) or barium calcium titanate ((Ba, Ca)$TiO_3$:Pr) doped with a transition metal or a rare earth; and calcium yttrium aluminate ($CaYAl_3O_7$:Ce).

REFERENCE SIGNS LIST

1, 2, 3, 4A, 4B, 5 Semiconductor package
10 Substrate
20, 20A, 20B, 20C Electronic component (semiconductor, element)
20D Interposer
21 Terminal (ball terminal)
21C Corner terminal
30 Side wall plate
40 Ceiling plate
100 Land
100C Corner land
110 Recess
120 Stress light emitting body
130, 160 Light detection unit
150 Conductive transparent resin body
170 Stress light emitting block
170S, 170S' Stress light emitting sheet
180 Image capturing means (image recording means)
200 Base material unit
300 Stress detection unit
310 Power supply unit
320, 340 Comparison unit
330 Damage detection unit
350 Holding unit

The invention claimed is:
1. A substrate, comprising:
a base material unit;
a first land that includes:
a stress light emitting body configured to emit light based on stress between the substrate and an element; and
a transparent member joined with a terminal of the element;
a light detection unit between the base material unit and the first land, wherein the light detection unit is configured to detect the light from the stress light emitting body;
a stress detection unit that includes a damage detection unit, wherein the stress detection unit is configured to detect the stress in the first land based on a first detection result of the detection of the light by the light detection unit; and
the damage detection unit configured to detect damage of a joint part between the terminal and the first land based on the detected stress.

2. The substrate according to claim 1, further comprising a plurality of lands that includes the first land, wherein
the plurality of lands is connected to a plurality of terminals of the element, and
the plurality of terminals includes the terminal.

3. The substrate according to claim 1, wherein
the first land is at a corner of the substrate,
the terminal is at a corner of the element, and
the terminal, joined to the first land at the corner of the substrate, has a wiring structure not having a function as a signal line through which an electric signal passes between inside and outside of the element.

4. The substrate according to claim 1, wherein the light detection unit is further configured to output an electric signal based on the detected light.

5. The substrate according to claim 1, wherein the stress detection unit is further configured to:
compare the first detection result of the light detection unit with a threshold value; and
detect the stress based on the comparison.

6. The substrate according to claim 1, wherein the stress detection unit is further configured to detect the stress based on a change in the first detection result of the light detection unit.

7. The substrate according to claim 6, wherein
the stress detection unit further includes a holding unit,
the holding unit is configured to hold the first detection result of the light detection unit, and
the stress detection unit is further configured to:
compare a second detection result of the light detection unit with the first detection result held by the holding unit; and
detect a change in the stress based on the comparison of the second detection result with the held first detection result.

8. The substrate according to claim 1, further comprising a plurality of light detection units between the base material unit and the first land, wherein
the plurality of light detection units includes the light detection unit,
the stress detection unit is further configured to detect the stress based on a plurality of detection results of the plurality of the light detection units, and
the plurality of detection results includes the first detection result.

9. The substrate according to claim 1, wherein the first land is in a recess in the base material unit.

10. A semiconductor package, comprising:
a substrate;
a semiconductor mountable on the substrate, wherein the semiconductor includes a plurality of terminals, a resin body, and a transparent body on the resin body;
a first stress light emitting body configured to emit light based on a damage of a terminal of the plurality of terminals of the semiconductor; and
a second stress light emitting body in contact with an outside of each of the resin body and the transparent body, wherein
the second stress light emitting body is configured to emit light based on a damage of a package of the semiconductor, and
the light emitted by the second stress light emitting body is detectable from outside of the semiconductor package.

11. The semiconductor package according to claim 10, wherein
the second stress light emitting body is a sheet-shaped stress light emitting body on an interface the resin body and a glass body of the package, and
the glass body is the transparent body.

12. The semiconductor package according to claim 10, wherein
a light beam of the emitted light by the second stress light emitting body includes a wavelength different from a wavelength in a visible light band, and
the wavelength of the light beam is a wavelength one of an ultraviolet ray or a near infrared ray.

13. The semiconductor package according to claim 10, wherein
the terminal is at a corner portion of the semiconductor among the plurality of terminals of the semiconductor, and
the first stress light emitting body is only at the terminal that is at the corner portion of the semiconductor among the plurality of terminals of the semiconductor.

14. The semiconductor package according to claim 10, further comprising an image capturing device within a vicinity of the package of the semiconductor, wherein the image capturing device is configured to detect the light emitted by the second stress light emitting body.

15. The semiconductor package according to claim 10, wherein the second stress light emitting body includes at least one of:
strontium aluminate ($SrAl_2O_4$:Eu) doped with europium and structurally controlled,
zinc sulfide (ZnS:Mn) or barium calcium titanate ((Ba, Ca) $TiO_3$:Pr) doped with a transition metal or a rare earth, or
calcium yttrium aluminate ($CaYAl_3O_7$:Ce).

* * * * *